United States Patent
Mikawa et al.

(10) Patent No.: US 12,060,653 B2
(45) Date of Patent: Aug. 13, 2024

(54) BULK GaN CRYSTAL, C-PLANE GaN WAFER, AND METHOD FOR MANUFACTURING BULK GaN CRYSTAL

(71) Applicant: MITSUBISHI CHEMICAL CORPORATION, Tokyo (JP)

(72) Inventors: Yutaka Mikawa, Tokyo (JP); Tetsuo Okano, Tokyo (JP)

(73) Assignee: MITSUBISHI CHEMICAL CORPORATION, Tokyo (JP)

(*) Notice: Subject to any disclaimer, the term of this patent is extended or adjusted under 35 U.S.C. 154(b) by 88 days.

(21) Appl. No.: 17/560,427

(22) Filed: Dec. 23, 2021

(65) Prior Publication Data

US 2022/0112624 A1   Apr. 14, 2022

Related U.S. Application Data

(63) Continuation of application No. PCT/JP2020/025626, filed on Jun. 30, 2020.

(30) Foreign Application Priority Data

Jul. 1, 2019   (JP) .................................. 2019-122799

(51) Int. Cl.
    *B32B 3/00*   (2006.01)
    *C30B 7/10*   (2006.01)
    (Continued)

(52) U.S. Cl.
    CPC ............ *C30B 29/406* (2013.01); *C30B 7/105* (2013.01); *C30B 25/20* (2013.01)

(58) Field of Classification Search
    CPC .............................. C30B 29/406; C30B 25/20
    See application file for complete search history.

(56) References Cited

U.S. PATENT DOCUMENTS

2008/0029783 A1   2/2008   Ueno
2008/0308815 A1   12/2008  Kasai et al.
(Continued)

FOREIGN PATENT DOCUMENTS

CN   103959437 A   7/2014
CN   109563641 A   4/2019
(Continued)

OTHER PUBLICATIONS

JP 2018-024538 (Year: 2018).*
(Continued)

*Primary Examiner* — Elizabeth E Mulvaney
(74) *Attorney, Agent, or Firm* — Element IP, PLC

(57) ABSTRACT

Provided is a bulk GaN crystal in which the degree of curvature of the c-plane is reduced. The bulk GaN crystal includes a main surface selected from a surface inclined at 0° to 10° from the (0001) crystal plane and a surface inclined at 0° to 10° from the (000-1) crystal plane, and the main surface is a specific main surface A that satisfies the following conditions (i) and (ii): (i) a first line, which is a 80 mm-long virtual line segment extending in a first direction on the specific main surface A, can be drawn, and a difference between a maximum value and a minimum value of peak angles in (002) XRD rocking curves of the GaN crystal, which is measured between 17 measurement points arranged at a 5-mm pitch on the first line with the omega axis being perpendicular to the first direction, is 0.05° or less; and (ii) a second line, which is a 80 mm-long virtual line segment extending in a second direction perpendicular to the first direction on the specific main surface A, can be drawn, and a difference between a maximum value and a minimum value of peak angles in (002) XRD rocking curves of the GaN crystal, which is measured between 17 measurement points arranged at a 5-mm pitch on the second line with the (Continued)

omega axis being perpendicular to the second direction, is 0.05° or less.

31 Claims, 13 Drawing Sheets

(51) Int. Cl.
*C30B 25/20* (2006.01)
*C30B 29/40* (2006.01)

(56) References Cited

U.S. PATENT DOCUMENTS

| | | | |
|---|---|---|---|
| 2013/0082279 A1 | 4/2013 | Faurie et al. | |
| 2015/0023862 A1* | 1/2015 | Ishiguro | C30B 29/403 |
| | | | 423/406 |
| 2017/0352721 A1 | 12/2017 | Iso et al. | |
| 2019/0003078 A1 | 1/2019 | D'Evelyn et al. | |

FOREIGN PATENT DOCUMENTS

| | | |
|---|---|---|
| CN | 109563642 A | 4/2019 |
| JP | 2009018983 A | 1/2009 |
| JP | 2014534941 A | 12/2014 |
| JP | 2016088756 A | 5/2016 |
| JP | 2017031029 A | 2/2017 |
| JP | 2018024538 A | 2/2018 |
| JP | 2018024539 A | 2/2018 |
| WO | WO-2016136552 A1 | 9/2016 |

OTHER PUBLICATIONS

Extended European Search Report issued Jun. 27, 2022 in EP Patent Application No. 20835168.4, 8 pages.
English translation International Preliminary Report on Patentability and Written Opinion issued Dec. 28, 2021 in PCT/JP2020/025626, 6 pages.
International Search Report issued Sep. 1, 2020 in PCT/JP2020/025626, 2 pages.
Combined Chinese Office Action and Search Report issued Jul. 11, 2023 in Patent Application No. 202080047247.2 with Machine English translation, 37 pages.
Combined Taiwanese Office Action and Search Report issued Feb. 7, 2024 in corresponding Taiwanese Patent Application No. 109122058 (with machine English translation), 36 pages.
Office Action issued Mar. 12, 2024 in corresponding Chinese Patent Application No. 202080047247.2 (with machine English translation), 32 pages.
Office Action issued Jun. 11, 2024 in corresponding Japanese Patent Application No. 2021-530031 (with machine English translation), 8 pages.
Office Action issued May 28, 2024 in corresponding Korean Patent Application No. 10-2022-7003363 (with machine English translation), 18 pages.

* cited by examiner

BULK GaN CRYSTAL, C-PLANE GaN WAFER, AND METHOD FOR MANUFACTURING BULK GaN CRYSTAL

CROSS-REFERENCE TO RELATED APPLICATION

This is a continuation of International Application PCT/JP2020/025626, filed on Jun. 30, 2020, and designated the U.S., and claims priority from Japanese Patent Application 2019-122799 which was filed on Jul. 1, 2019, the entire contents of which are incorporated herein by reference.

TECHNICAL FIELD

The present invention mainly relates to a bulk GaN crystal, a c-plane GaN wafer, and a method of producing a bulk GaN crystal.

BACKGROUND ART

GaN (gallium nitride) has a wurtzite-type crystal structure belonging to a hexagonal system.

In recent years, GaN wafers that are self-supporting wafers composed of GaN crystals have attracted attention as substrates for nitride semiconductor devices.

A nitride semiconductor device is a semiconductor device which includes a nitride semiconductor in a major part of the device structure. A nitride semiconductor is also called "nitride-based Group III-V compound semiconductor", "Group III nitride-based compound semiconductor", "GaN-based semiconductor" or the like, and contains GaN along with a compound obtained by partially or entirely substituting gallium of GaN with other Periodic Table Group 13 element (e.g., B, Al, or In).

GaN wafers with various plane orientations have been reported and, thereamong, GaN wafers having main surfaces (large-area surfaces) substantially parallel to the (000±1) crystal plane, namely c-plane GaN wafers, have been intensively studied and developed for application to high-output laser diodes and power semiconductor devices.

The production process of a c-plane GaN wafer may include the step of slicing a bulk GaN crystal, which has been grown in the c-axis direction, substantially parallel to the c-plane. In the thus sliced c-plane GaN wafer, an off-cut angle variation within a main surface is related to the curvature of the c-plane in the unsliced bulk GaN crystal (Patent Document 1).

RELATED ART DOCUMENT

Patent Document

Patent Document 1: U.S. Patent Application Publication No. 2008/0029783

SUMMARY OF THE INVENTION

Problems to be Solved by the Invention

In order to produce a c-plane GaN wafer having a narrow variation range of off-cut angle within a main surface, it is necessary to grow a bulk GaN crystal having an improved c-plane curvature. In this case, a reduction in the degree of curvature is referred to as "improvement of the curvature". Objects of the present invention at least include: to provide a bulk GaN crystal having an improved c-plane curvature; to provide a c-plane GaN wafer in which an off-cut angle variation within a main surface is reduced; and to provide a novel method of producing a bulk GaN crystal.

Means for Solving the Problems

Embodiments of the present invention encompass, but not limited to, the followings.

[1] A bulk GaN crystal, including a main surface selected from a surface inclined at 0° to 10° from the (0001) crystal plane and a surface inclined at 0° to 10° from the (000-1) crystal plane,
  wherein the main surface is a specific main surface A that satisfies the following conditions (i) and (ii):
  (i) a first line, which is a 80 mm-long virtual line segment extending in a first direction on the specific main surface A, can be drawn, and a difference between a maximum value and a minimum value of peak angles in (002) XRD rocking curves of the GaN crystal, which is measured between 17 measurement points arranged at a 5-mm pitch on the first line with the omega axis being perpendicular to the first direction, is 0.05° or less; and
  (ii) a second line, which is a 80 mm-long virtual line segment extending in a second direction perpendicular to the first direction on the specific main surface A, can be drawn, and a difference between a maximum value and a minimum value of peak angles in (002) XRD rocking curves of the GaN crystal, which is measured between 17 measurement points arranged at a 5-mm pitch on the second line with the omega axis being perpendicular to the second direction, is 0.05° or less.

[2] A bulk GaN crystal, including a first main surface and a second main surface that face the opposite direction from each other,
  wherein
  one of the first main surface and the second main surface is a surface inclined at 0° to 10° from the (0001) crystal plane while the other is a surface inclined at 0° to 10° from the (000-1) crystal plane, and
  the bulk GaN crystal satisfies the following conditions (i) and (ii):
  (i) a first line, which is a 80 mm-long virtual line segment extending in a first direction on the first main surface, can be drawn, and a difference between a maximum value and a minimum value of peak angles in (002) XRD rocking curves of the GaN crystal, which is measured between 17 measurement points arranged at a 5-mm pitch on the first line with the omega axis being perpendicular to the first direction, is 0.05° or less; and
  (ii) a second line, which is a 80 mm-long virtual line segment extending in a second direction perpendicular to the first direction on the first main surface, can be drawn, and a difference between a maximum value and a minimum value of peak angles in (002) XRD rocking curves of the GaN crystal, which is measured between 17 measurement points arranged at a 5-mm pitch on the second line with the omega axis being perpendicular to the second direction, is 0.05° or less.

[3] The bulk GaN crystal according to [1] or [2], wherein the difference between the maximum value and the minimum value of the peak angles in the condition (i) and the difference between the maximum value and the minimum value of the peak angles in the condition (ii) are both 0.02° or less.

[4] The bulk GaN crystal according to any one of [1] to [3], wherein neither the 17 measurement points in the condition (i) nor the 17 measurement points in the condition (ii) includes a measurement point at which the peak angle is different by 0.01° or more from the peak angle at an adjacent measurement point.

[5] The bulk GaN crystal according to any one of [1] to [4], wherein the radius of curvature of the surface along the first direction, which is calculated from a rate of peak angle change in the condition (i), and the radius of curvature of the surface along the second direction, which is calculated from a rate of peak angle change in the condition (ii), are both 300 m or larger.

[6] The bulk GaN crystal according to any one of [1] and [3] to [5], having a dislocation density of lower than $1 \times 10^6$ $cm^{-2}$ in all of 100 μm×100 μm virtual regions that can be arbitrarily arranged on the specific main surface A, except for the portion having a distance of less than 5 mm from the outer circumference in a plan view.

[7] The bulk GaN crystal according to any one of [1] and [3] to [6], having a dislocation density of lower than $1 \times 10^5$ $cm^{-2}$ in all of 2 mm×2 mm virtual regions that can be arbitrarily arranged on the specific main surface A, except for the portion having a distance of less than 5 mm from the outer circumference in a plan view.

[8] The bulk GaN crystal according to any one of [2] to [5], having a dislocation density of lower than $1 \times 10^6$ $cm^{-2}$ in all of 100 μm×100 μm virtual regions that can be arbitrarily arranged on the first main surface, except for the portion having a distance of less than 5 mm from the outer circumference in a plan view, which dislocation density is calculated from the number of dislocations existing in each region and the area of the region.

[9] The bulk GaN crystal according to any one of [2] to [5] and [8], having a dislocation density of lower than $1 \times 10^5$ $cm^{-2}$ in all of 2 mm×2 mm virtual regions that can be arbitrarily arranged on the first main surface, except for the portion having a distance of less than 5 mm from the outer circumference in a plan view, which dislocation density is calculated from the number of dislocations existing in each region and the area of the region.

[10] The bulk GaN crystal according to any one of [1] to [9], satisfying one or more conditions selected from the following (a) to (g):
(a) the H concentration is $1 \times 10^{17}$ atoms/cm$^3$ or higher;
(b) the O concentration is $1 \times 10^{17}$ atoms/cm$^3$ or higher;
(c) the concentration of at least one of Li, Na, and K is lower than $1 \times 10^{15}$ atoms/cm$^3$;
(d) the F concentration is $1 \times 10^{15}$ atoms/cm$^3$ or higher;
(e) the concentration of at least one of Cl, Br, and I is $1 \times 10^{15}$ atoms/cm$^3$ or higher;
(f) the I concentration is $1 \times 10^{15}$ atoms/cm$^3$ or higher; and
(g) the Si concentration is lower than $2 \times 10^{15}$ atoms/cm$^3$.

[11] The bulk GaN crystal according to [9], having a peak attributed to a gallium vacancy-hydrogen complex at 3,140 to 3,200 cm$^{-1}$ in an infrared absorption spectrum.

[12] A method of producing a c-plane GaN wafer, the method including at least the steps of:
preparing the bulk GaN crystal according to any one of [1] to [11]; and
slicing the GaN crystal.

[13] The method according to [12], wherein
the c-plane GaN wafer has a disk shape, and
a circle constituting the disk shape has a diameter of 50 mm or larger.

[14] A c-plane GaN wafer, including a main surface selected from a surface inclined at 0° to 10° from the (0001) crystal plane and a surface inclined at 0° to 10° from the (000-1) crystal plane,
wherein the main surface is a specific main surface B that satisfies the following condition (iii):
(iii) on the specific main surface B, a virtual line segment of 50 mm or longer can be drawn, and a variation range of an m-axis direction component of an off-cut angle and that of an a-axis direction component of the off-cut angle are both 0.05° or less, except for the portion having a distance of less than 5 mm from the outer circumference in a plan view.

[15] A c-plane GaN wafer, including a third main surface and a fourth main surface that face the opposite direction from each other, one of which third main surface and fourth main surface is a surface inclined at 0° to 10° from the (0001) crystal plane while the other is a surface inclined at 0° to 10° from the (000-1) crystal plane,
wherein, on the third main surface, a virtual line segment of 50 mm or longer can be drawn, and a variation range of an m-axis direction component of an off-cut angle and that of an a-axis direction component of the off-cut angle are both 0.05° or less, except for the portion having a distance of less than 5 mm from the outer circumference in a plan view.

[16] The c-plane GaN wafer according to [14] or [15], wherein the variation range of the m-axis direction component of the off-cut angle and that of the a-axis direction component of the off-cut angle are both 0.02° or less.

[17] The c-plane GaN wafer according to any one of [14] to [16], having a diameter selected from 50 mm to 55 mm, 75 mm to 80 mm, 100 mm to 105 mm, and 150 mm to 155 mm.

[18] The c-plane GaN wafer according to any one of [14], [16] and [17], having a dislocation density of lower than $1 \times 10^6$ cm$^{-2}$ in all of 100 μm×100 μm virtual regions that can be arbitrarily arranged on the specific main surface B, except for the portion having a distance of less than 5 mm from the outer circumference in a plan view.

[19] The c-plane GaN wafer according to any one of [14], [16], [17] and [18], having a dislocation density of lower than $1 \times 10^5$ cm$^{-2}$ in all of 2 mm×2 mm virtual regions that can be arbitrarily arranged on the specific main surface B, except for the portion having a distance of less than 5 mm from the outer circumference in a plan view.

[20] The c-plane GaN wafer according to any one of [15] to [17], having a dislocation density of lower than $1 \times 10^6$ cm$^{-2}$ in all of 100 μm×100 μm virtual regions that can be arbitrarily arranged on the third main surface, except for the portion having a distance of less than 5 mm from the outer circumference in a plan view.

[21] The c-plane GaN wafer according to any one of [15] to [17] and [20], having a dislocation density of lower than $1 \times 10^5$ cm$^{-2}$ in 2 mm×2 mm virtual regions that can be arbitrarily arranged on the third main surface, except for the portion having a distance of less than 5 mm from the outer circumference in a plan view.

[22] The c-plane GaN wafer according to any one of [14] to [21], satisfying one or more conditions selected from the following (a) to (g):
(a) the H concentration is $1 \times 10^{17}$ atoms/cm$^3$ or higher;
(b) the O concentration is $1 \times 10^{17}$ atoms/cm$^3$ or higher;
(c) the concentration of at least one of Li, Na, and K is lower than $1 \times 10^{15}$ atoms/cm$^3$;
(d) the F concentration is $1 \times 10^{15}$ atoms/cm$^3$ or higher;
(e) the concentration of at least one of Cl, Br, and I is $1 \times 10^{15}$ atoms/cm$^3$ or higher;
(f) the I concentration is $1 \times 10^{15}$ atoms/cm$^3$ or higher; and
(g) the Si concentration is lower than $2 \times 10^{15}$ atoms/cm$^3$.

[23] The c-plane GaN wafer according to [22], having a peak attributed to a gallium vacancy-hydrogen complex at 3,140 to 3,200 cm$^{-1}$ in an infrared absorption spectrum.

[24] An epitaxial wafer, including:
the c-plane GaN wafer according to any one of [14] to [23]; and
at least one nitride semiconductor layer epitaxially grown on the c-plane GaN wafer.

[25] A method of producing an epitaxial wafer, the method including the steps of:
preparing the c-plane GaN wafer according to any one of [14] to [23]; and
epitaxially growing at least one nitride semiconductor layer on the c-plane GaN wafer.

[26] A method of producing a nitride semiconductor device, the method including the steps of:
preparing the c-plane GaN wafer according to any one of [14] to [23]; and
epitaxially growing at least one nitride semiconductor layer on the c-plane GaN wafer.

[27] A method of producing a bulk GaN crystal, the method including the steps of:
preparing the c-plane GaN wafer according to any one of [14] to [23]; and
epitaxially growing a GaN crystal from a vapor phase on the c-plane GaN wafer.

[28] A method of producing a bulk GaN crystal, the method including the step of growing a GaN crystal on a seed assembly by an ammonothermal method,
wherein
the seed assembly is constituted by plural c-plane GaN wafers, and
a metal wire is used for immobilizing the plural c-plane GaN wafers with one another.

[29] The method of producing a bulk GaN crystal according [28], wherein the orientations of the c-axes, a-axes, and m-axes of all of the c-plane GaN wafers constituting the seed assembly are aligned.

[30] The method of producing a bulk GaN crystal according to [29], wherein, when the direction of N-polar side of main surfaces of the c-plane GaN wafers constituting the seed assembly is defined as front direction, two or more c-plane GaN wafers each having a rectangular or substantially rectangular main surface are arranged adjacent to each other on the front-direction side of the seed assembly, and a c-plane GaN wafer is arranged on the opposite side of the front direction of the seed assembly.

[31] The method of producing a bulk GaN crystal according to any one of [28] to [30], wherein, in the step of growing a GaN crystal by an ammonothermal method, a mineralizer containing a halogen-containing compound is used, and at least one metal wire selected from a Pt wire and an Au wire is used as the metal wire.

Effects of the Invention

One mode provides a bulk GaN crystal having an improved c-plane curvature, and another mode provides a c-plane GaN wafer in which an off-cut angle variation within a main surface is reduced. Yet another mode provides a novel method of producing a bulk GaN crystal.

The c-plane GaN wafer in which an off-cut angle variation within a main surface is reduced enables to not only reduce a difference in performance between individual semiconductor device chips that are produced from the GaN wafer, but also attain a uniform lot-to-lot quality.

MODE FOR CARRYING OUT THE INVENTION

Figure 1:
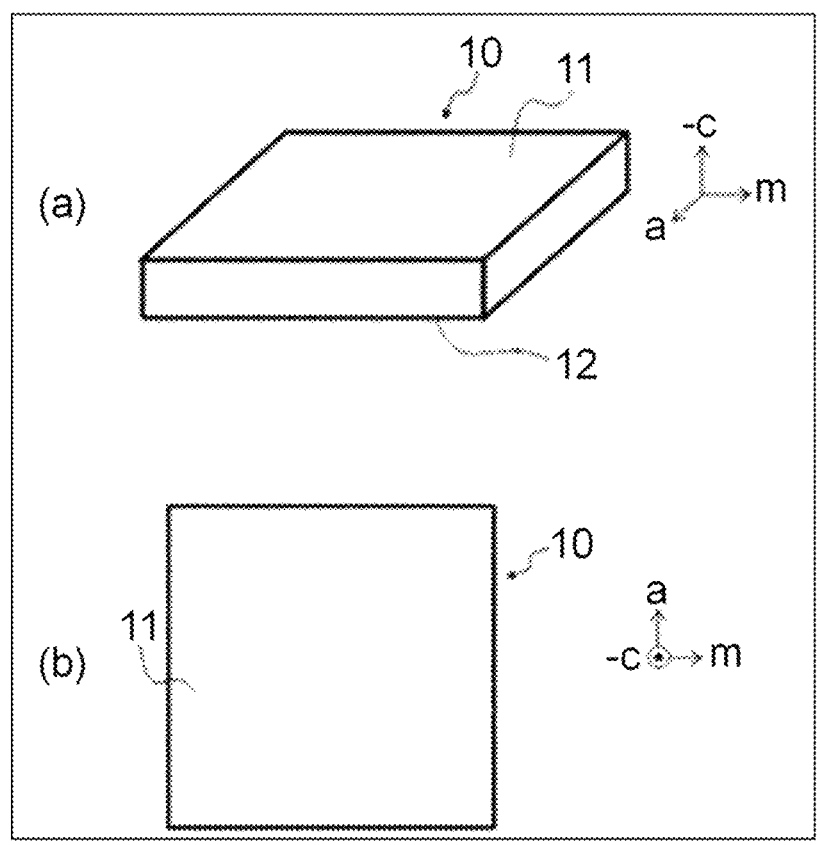
FIG. 1 illustrates one example of a bulk GaN crystal according to a preferred embodiment. Panel (a) of FIG. 1 is a perspective view, and Panel (b) of FIG. 1 is a plan view.

In a GaN crystal, the (0001) crystal plane and the (000-1) crystal plane are generally referred to as "c-plane", and the {10-10} crystal plane and the {11-20}crystal plane are referred to as "m-plane" and "a-plane", respectively. A crystallographic axis perpendicular to the c-plane is referred to as "c-axis", a crystallographic axis perpendicular to the m-plane is referred to as "m-axis", and a crystallographic axis perpendicular to the a-plane is referred to as "a-axis".

Unless otherwise specified, the terms "crystallographic axis", "crystal plane", "crystal orientation" and the like that are used herein mean a crystallographic axis, a crystal plane, a crystal orientation and the like of a GaN crystal, respectively.

The Miller indices (hkil) of a hexagonal crystal has a relationship of h+k=i and, therefore, may be expressed in three digits of (hkl). For example, (0002) is expressed as "(002)" in three digits.

In the present specification, for the sake of convenience, the (0001) crystal plane and the (000-1) crystal plane may be collectively referred to as "(000±1) crystal plane". In the drawings, the [0001] direction is indicated as "+c direction", and the [000-1] direction is indicated as "-c direction".

Embodiments of the present invention will now be described referring to the drawings as appropriate. The following descriptions are merely examples (representative examples) of the embodiments of the present invention, and the present invention is not limited to the contents thereof within the gist of the present invention.

Unless otherwise specified, the expression "X to Y" (wherein, X and Y are arbitrary numbers) used herein encompasses not only the meaning of "X or more but Y or less", but also the meaning of "preferably larger than X" and "preferably smaller than Y".

Further, in the present specification, the term "independently" used for describing two or more subjects together means that the two or more subjects may be the same or different from each other.

1. BULK GAN CRYSTAL

One embodiment of the present invention relates to a bulk GaN crystal.

A first mode of the bulk GaN crystal according to one embodiment of the present invention is a bulk GaN crystal having a main surface selected from a surface inclined at 0° to 10° from the (0001) crystal plane and a surface inclined at 0° to 10° from the (000-1) crystal plane, and the main surface is a specific main surface A that satisfies the following conditions (i) and (ii):
  (i) a first line, which is a 80 mm-long virtual line segment extending in a first direction on the specific main surface A, can be drawn, and a difference between a maximum value and a minimum value of peak angles in (002) XRD rocking curves of the GaN crystal, which is measured between 17 measurement points arranged at a 5-mm pitch on the first line with the omega axis being perpendicular to the first direction, is 0.05° or less; and
  (ii) a second line, which is a 80 mm-long virtual line segment extending in a second direction perpendicular to the first direction on the specific main surface A, can be drawn, and a difference between a maximum value and a minimum value of peak angles in (002) XRD rocking curves of the GaN crystal, which is measured between 17 measurement points arranged at a 5-mm pitch on the second line with the omega axis being perpendicular to the second direction, is 0.05° or less.

Further, a second mode of the bulk GaN crystal according to one embodiment of the present invention is a bulk GaN crystal having a first main surface and a second main surface that face the opposite direction from each other. One of the first main surface and the second main surface is a surface inclined at 0° to 10° from the (0001) crystal plane while the other is a surface inclined at 0° to 10° from the (000-1) crystal plane, and the bulk GaN crystal satisfies the following conditions (i) and (ii):
  (i) a first line, which is a 80 mm-long virtual line segment extending in a first direction on the first main surface, can be drawn, and a difference between a maximum value and a minimum value of peak angles in (002) XRD rocking curves of the GaN crystal, which is measured between 17 measurement points arranged at a 5-mm pitch on the first line with the omega axis being perpendicular to the first direction, is 0.050 or less; and
  (ii) a second line, which is a 80 mm-long virtual line segment extending in a second direction perpendicular to the first direction on the first main surface, can be drawn, and a difference between a maximum value and a minimum value of peak angles in (002) XRD rocking curves of the GaN crystal, which is measured between 17 measurement points arranged at a 5-mm pitch on the second line with the omega axis being perpendicular to the second direction, is 0.05° or less.

In the above-described first mode, from the standpoint of obtaining the effects of the present invention, the mode of other surfaces constituting the bulk GaN crystal is not particularly restricted and other surfaces may be flat or have irregularities, as long as the bulk GaN crystal has a main surface selected from a surface inclined at 0° to 10° from the (0001) crystal plane and a surface inclined at 0° to 10° from the (000-1) crystal plane.

In the bulk GaN crystal of the first mode, one selected from a surface inclined at 0° to 10° from the (0001) crystal plane and a surface inclined at 0° to 10° from the (000-1) crystal plane is a specific main surface A, and the bulk GaN crystal has another main surface on the opposite side of the specific main surface A. When this main surface on the opposite side is one of the above-described two surfaces that is not selected as the specific main surface A, this bulk GaN crystal has the same mode as the bulk GaN crystal of the second mode. In this case, the specific main surface A in the first mode is the first main surface in the second mode.

Specific mode of the bulk GaN crystal of the second mode (hereinafter, also simply referred to as "bulk GaN crystal") will now be described, and the constituents and characteristics of the requirements as well as the use and the like of the bulk GaN crystal, including the conditions (i) and (ii), are also applicable to the bulk GaN crystal of the first mode in the same manner.

FIG. 1 illustrates one example of a bulk GaN crystal according to a preferred embodiment. Panel (a) of FIG. 1 is a perspective view, and Panel (b) of FIG. 1 is a plan view.

Referring to FIG. 1, a bulk crystal 10 is a plate consisting of only a GaN crystal, and has two main surfaces (large-area surfaces) facing the opposite direction from each other, namely a first main surface 11 and a second main surface 12. One of the first main surface 11 and the second main surface 12 is Ga-polar while the other main surface is N-polar. The first main surface 11 and the second main surface 12 are parallel to each other; however, they are not necessarily required to be strictly parallel to each other.

When the first main surface 11 is Ga-polar and the second main surface 12 is N-polar, an inclination of the first main surface with respect to the (0001) crystal plane is 0° to 10°. The "inclination of the first main surface with respect to the (0001) crystal plane" is, in other words, an angle formed by the [0001] direction of the bulk crystal 10 and a normal vector of the first main surface.

When the first main surface 11 is N-polar and the second main surface 12 is Ga-polar, an inclination of the first main surface with respect to the (000-1) crystal plane is 0° to 10°.

The first main surface 11 and the second main surface 12 may be in an as-grown state of the crystal, or may each be a surface that has been processed and thereby planarized.

The first main surface 11 of the bulk crystal 10 may have a substantially rectangular shape, and two of the sides constituting the substantially rectangular shape are substantially parallel to the orthogonal projection of the m-axis on the first main surface 11, while the other two sides are substantially parallel to the orthogonal projection of the a-axis on the first main surface 11. The second main surface 12 has substantially the same shape and dimensions as the first main surface 11.

In a modification example, the first main surface 11 may have a shape other than a rectangular shape. For example, the first main surface 11 may have a shape obtained by partially or entirely cutting off the four corners of a rectangle, or may have a hexagonal shape, a circular shape, or an irregular shape.

The first main surface 11 of the bulk crystal 10 has at least an area on which two lines that are 80 mm-long virtual line segments perpendicular to each other can be drawn.

When the first main surface 11 of the bulk crystal 10 is circular, the first main surface 11 preferably has an area on which a virtual circle having a diameter of preferably 85 mm, more preferably 110 mm can be drawn, and the first main surface 11 may have an area on which a virtual circle of 160 mm in diameter can be drawn.

The thickness of the bulk crystal 10, i.e. the dimension in the direction perpendicular to the first main surface 11 and the second main surface 12, is preferably 1 mm or larger, more preferably 2 mm or larger, but preferably 30 mm or smaller, more preferably 20 mm or smaller.

In a GaN crystal having a main surface oriented with the c-axis, the curvature of the c-plane can be evaluated by measuring (002) XRD rocking curves using the c-plane as a reflection surface at regular intervals along a measurement line extending on the main surface, and examining the change in peak angle.

In the measurement of XRD rocking curves at the respective measurement points, the omega axis is set perpendicular to the measurement line. This enables to determine how the tilt of the c-axis in the direction of the measurement line changes along the measurement line, i.e. the state of the curvature of the c-plane in the direction of the measurement line.

The "omega axis" is the rotation axis of a sample used in the measurement of XRD rocking curves. The measurement of XRD rocking curves is also referred to as "omega scan".

Figure 2:
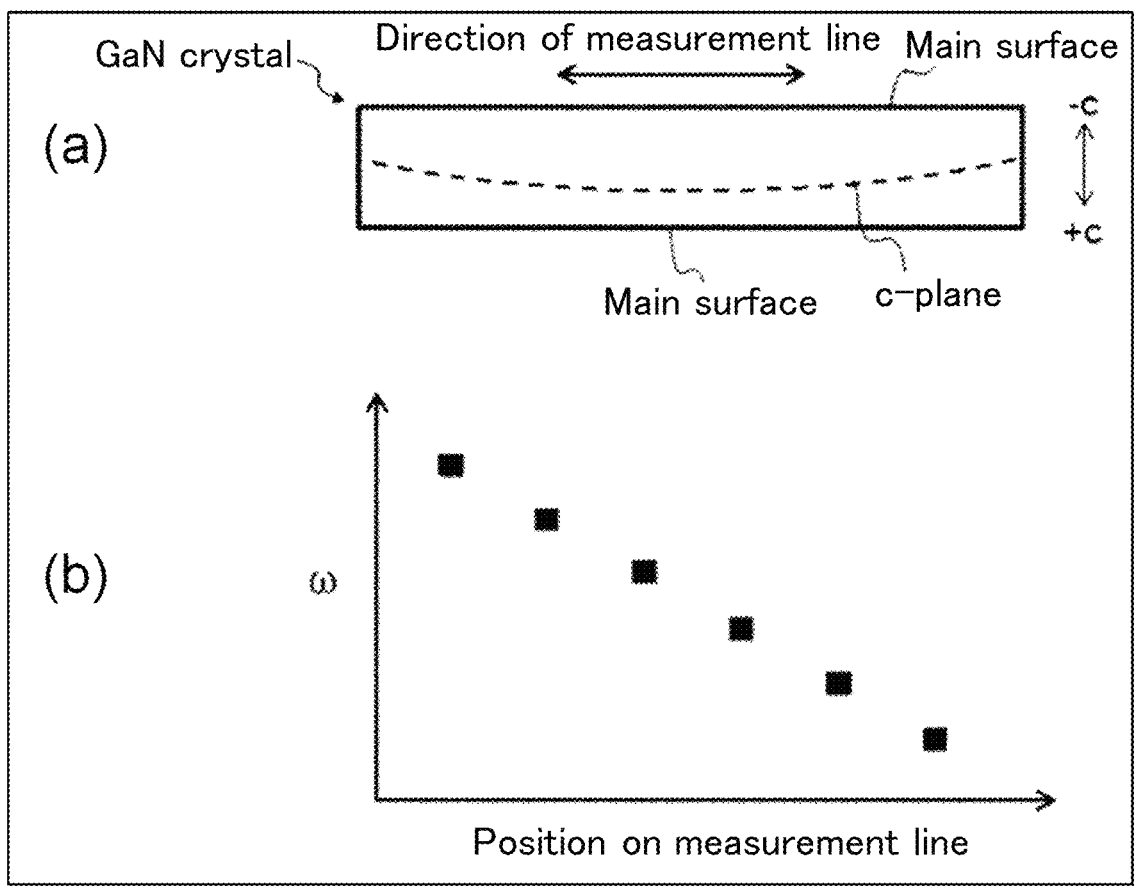
FIG. 2 Panel (a) of FIG. 2 is a cross-sectional view of a GaN crystal in which the c-plane is curved over a long distance along the direction of a measurement line, and Panel (b) of FIG. 2 is a graph obtained by measuring XRD rocking curves on the measurement line of the GaN crystal illustrated in Panel (a) of FIG. 2 using the c-plane as a reflection surface, and plotting their peak angles against the positions of the respective measurement points.

For example, a GaN crystal in which the c-plane is curved over a long distance along the direction of a measurement line as illustrated in Panel (a) of FIG. 2 yields such a graph as shown in Panel (b) of FIG. 2 when XRD rocking curves are measured on the measurement line using the c-plane as a reflection surface and their peak angles w are plotted against the positions of the respective measurement points. A higher degree of curvature leads to a higher w change rate.

Figure 3:
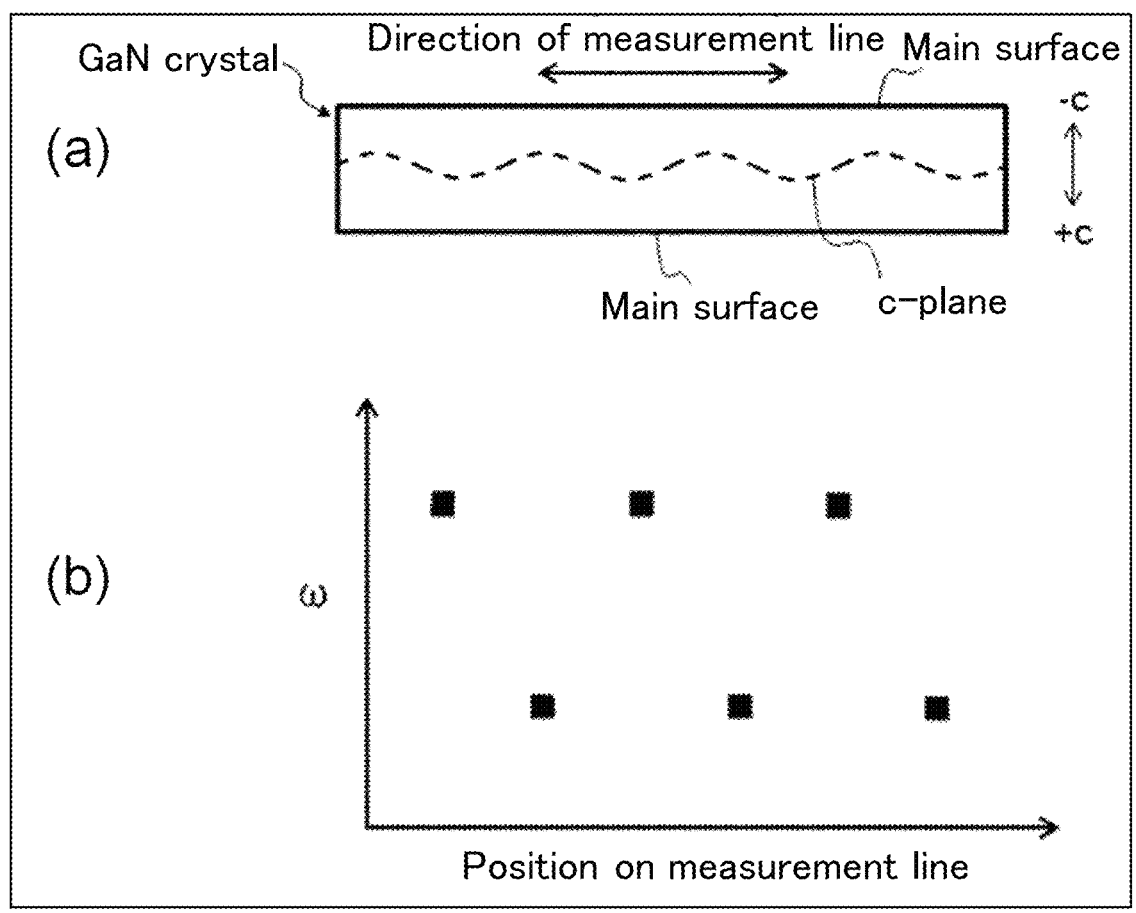
FIG. 3 Panel (a) of FIG. 3 is a cross-sectional view of a GaN crystal in which the c-plane is locally and strongly curved along the direction of a measurement line but not curved over a long distance, and Panel (b) of FIG. 3 is a graph obtained by measuring XRD rocking curves on the measurement line of the GaN crystal illustrated in Panel (a) of FIG. 3 using the c-plane as a reflection surface, and plotting their peak angles against the positions of the respective measurement points.

On the other hand, in the example illustrated in Panel (a) of FIG. 3, the c-plane is locally and strongly curved along the direction of a measurement line; however, the direction of the curvature alternately shifts up and down along the measurement line, and no curvature over a long distance is observed. This GaN crystal yields such a graph as shown in Panel (b) of FIG. 3 when XRD rocking curves are measured on the measurement line in the same manner and their peak angles Go are plotted against the positions of the respective measurement points.

As understood from FIGS. 2 and 3, a maximum value and a minimum value of the peak angles of XRD rocking curves are increased not only by curvature of the c-plane over a long distance but also by local curvature.

In the bulk crystal 10, the curvature of the c-plane is improved to an extent that the following conditions (i) and (ii) are satisfied:

(i) a first line, which is a 80 mm-long virtual line segment extending in a first direction on the first main surface 11, can be drawn, and a difference between a maximum value and a minimum value of peak angles in (002) XRD rocking curves of the bulk crystal 10, which is measured between 17 measurement points arranged at a 5-mm pitch on the first line with the omega axis being perpendicular to the first direction, is 0.050 or less; and (ii) a second line, which is a 80 mm-long virtual line segment extending in a second direction perpendicular to the first direction on the first main surface 11, can be drawn, and a difference between a maximum value and a minimum value of peak angles in (002) XRD rocking curves of the bulk crystal 10, which is measured between 17 measurement points arranged at a 5-mm pitch on the second line with the omega axis being perpendicular to the second direction, is 0.05° or less.

In the conditions (i) and (ii), for example, the first direction may be perpendicular to the a-axis; however, the orientation of the first direction is not limited.

There may be plural lines that correspond to the first line prescribed in the condition (i); however, as long as at least one such line is found, i.e. as long as peak angles of (002) XRD rocking curves of the bulk crystal 10 are measured at a 5-mm pitch over a length of 80 mm on at least one line, which is a virtual line segment extending in the first direction, with the omega axis being perpendicular to the line and a difference between a maximum value and a minimum value of the thus measured peak angles is 0.05° or less, the degree of the curvature of the c-plane in the bulk crystal 10 can be evaluated to be sufficiently reduced for the first direction.

Similarly for the condition (ii), the degree of the curvature of the c-plane in the bulk crystal 10 can be evaluated to be sufficiently reduced for the second direction as long as peak angles of (002) XRD rocking curves of the bulk crystal 10 are measured at a 5-mm pitch over a length of 80 mm on at least one line, which is a virtual line segment extending in the second direction, with the omega axis being perpendicular to the line and a difference between a maximum value and a minimum value of the thus measured peak angles is 0.05° or less.

The difference between a maximum value and a minimum value of the peak angles of the rocking curves that is determined between 17 measurement points in the condition (i) and the difference between a maximum value and a minimum value of the peak angles of the rocking curves that is determined between 17 measurement points in the condition (ii) are independently preferably 0.04° or less, more preferably 0.03° or less, still more preferably 0.02° or less. This preferred range may be satisfied only in one of the conditions (i) and (ii); however, it is preferably satisfied in both of the conditions (i) and (ii).

For example, in an extreme hypothetical case where the curvature of the c-plane of the bulk crystal 10 in the first direction consists of only curvature over a long distance as illustrated in FIG. 2 and the peak angles of rocking curves monotonically change along the first line, the difference between a maximum value and a minimum value of the peak angles of the rocking curves between 17 measurement points in the condition (i) is equal to the difference in peak angle between two measurement points at the respective ends that are 80 mm apart from each other. In this case, the radius of curvature of the c-plane along the first direction increases to approximately 92 m, approximately 115 m, approximately 153 m, and approximately 229 m as the difference between the maximum value and the minimum value decreases to 0.05°, 0.04°, 0.03°, and 0.02°, respectively.

Preferably, the 17 measurement points in the condition (i) and the 17 measurement points in the condition (ii) independently include no measurement point at which the peak angle of the above-described rocking curve is different by 0.01° or more from the peak angle at an adjacent measurement point. In other words, on both of the first line and the second line, the tilt of the c-axis does not change 0.01° or more per 5 mm within an 80-mm section that includes the respective 17 measurement points. This means that there is no locally and strongly curved portion in the c-plane of the bulk crystal 10. The above-described preferred range may be satisfied only in one of the conditions (i) and (ii); however, it is preferably satisfied in both of the conditions (i) and (ii).

In a preferred example, the radius of curvature of the c-plane along the first direction, which is calculated from the peak angle change rate of the rocking curves between the 17 measurement points in the condition (i), and the radius of curvature of the c-plane along the second direction, which is calculated from the peak angle change rate of the rocking curves between the 17 measurement points in the condition (ii), are independently 300 m or larger. This preferred range may be satisfied only in one of the conditions (i) and (ii); however, it is preferably satisfied in both of the conditions (i) and (ii).

In the calculation of the radius of curvature, a linear approximation value obtained by least-squares method is used as the peak angle change rate of the rocking curves between the 17 measurement points.

In the bulk crystal 10, in all of 100 μm×100 μm regions on the first main surface 11, the dislocation density, which is calculated from the number of dislocations existing in each region and the area of the region, can be lower than $1\times10^6$ cm$^{-2}$, except for the portion having a distance of less than 5 mm from the outer circumference in a plan view. This can also be expressed as follows: in all of 100 μm×100 μm virtual regions that can be arbitrarily arranged on the first main surface excluding the portion having a distance of less than 5 mm from the outer circumference in a plan view, the dislocation density, which is calculated from the number of dislocations existing in each region and the area of the region, can be lower than $1\times10^6$ cm$^{-2}$. This paraphrastic expression also applies to the following description in the same manner.

In the bulk crystal 10, in all of 2 mm×2 mm regions on the first main surface 11 as well, the dislocation density, which is calculated from the number of dislocations existing in each region and the area of the region, can be lower than $1\times10^5$ cm$^{-2}$, except for the portion having a distance of less than 5 mm from the outer circumference in a plan view.

The dislocation density of the first main surface 11 can be examined by observing a cathodoluminescence (CL) image or a photoluminescence (PL) image. However, since the bulk crystal 10 is grown by an ammonothermal method, dislocations do not appear on a CL image or PL image of the bulk crystal 10 as dark spots with clear contrast due to the effect of strong yellow band emission. Therefore, in order to make dislocations more visible, a GaN thin film may be formed on the first main surface 11 by a vapor-phase method, and a surface CL image or surface PL image of this GaN thin film may be observed.

When the first main surface 11 is Ga-polar, the etch pit density may be regarded as the dislocation density. The first main surface 11 is planarized by chemical mechanical polishing (CMP) as required, and subsequently etched for 1 hour with 89% sulfuric acid heated to 270° C., whereby etch pits corresponding one-to-one with dislocations can be formed on the first main surface 11.

When the first main surface 11 is N-polar, after the bulk crystal 10 is cut in the thickness direction, the etch pit density is measured at the thus cut Ga-polar cross-section within a distance of several hundred micrometers from the first main surface 11, and the thus obtained value may be regarded as the dislocation density of the first main surface 11.

The bulk crystal 10 preferably satisfies one or more conditions selected from the following (a) to (g):
(a) the H concentration is $1\times10^{17}$ atoms/cm$^3$ or higher;
(b) the O concentration is $1\times10^{17}$ atoms/cm$^3$ or higher;
(c) the concentration of at least one of Li, Na, and K is lower than $1\times10^{15}$ atoms/cm$^3$;
(d) the F concentration is $1\times10^{15}$ atoms/cm$^3$ or higher;
(e) the concentration of at least one of Cl, Br, and I is $1\times10^{15}$ atoms/cm$^3$ or higher;
(f) the I concentration is $1\times10^{15}$ atoms/cm$^3$ or higher; and
(g) the Si concentration is lower than $2\times10^{15}$ atoms/cm$^3$.

The conditions (a) to (g) will now be described.

The bulk crystal 10 is grown by an ammonothermal method and, therefore, can contain H (hydrogen) at a concentration of $1\times10^{17}$ atoms/cm$^3$ or higher.

The bulk crystal 10 can contain 0, which originates from a raw material used in an ammonothermal method, at a concentration of $1\times10^{17}$ atoms/cm$^3$ or higher.

The bulk crystal 10 is preferably grown by an ammonothermal method that does not use any alkali metal-containing compound as a mineralizer; therefore, the concentration of at least one of Li (lithium), Na (sodium), and K (potassium) in the bulk crystal 10 can be lower than $1\times10^{15}$ atoms/cm$^3$.

The bulk crystal 10 is preferably grown by an ammonothermal method using a compound containing F (fluorine) as a mineralizer and, therefore, can contain F at a concentration of $1\times10^{15}$ atoms/cm$^3$ or higher.

Typical examples of the compound containing F that can be preferably used as a mineralizer include HF, $NH_4F$, and $GaF_3$. When HF is used, it may cause the generation of $NH_4F$ and $GaF_3$ by reacting with $NH_3$ added as a solvent and GaN added as a raw material in a growth vessel.

The bulk crystal 10 is preferably grown by an ammonothermal method using, as mineralizers, a compound containing a halogen other than F in addition to the compound containing F; therefore, the bulk crystal 10 can contain at least one of Cl, Br, and I at a concentration of $1\times10^{15}$ atoms/cm$^3$ or higher in addition to F.

Typical examples of the compound containing a halogen other than F that can be preferably used as a mineralizer include HCl, $NH_4Cl$, $GaCl_3$, HBr, $NH_4Br$, $GaBr_3$, HI, $NH_4I$, and $IGaI_3$. When HX (wherein, X=Cl, Br, or I) is used, it may cause the generation of $NH_4X$ and $GaX_3$ by reacting with $NH_3$ added as a solvent and GaN added as a raw material in a growth vessel.

The bulk crystal 10 is preferably grown by an ammonothermal method using, as mineralizers, a compound containing I (iodine) in addition to the compound containing F; therefore, the bulk crystal 10 can contain I at a concentration of $1\times10^{15}$ atoms/cm$^3$ or higher.

The bulk crystal 10 is grown by an ammonothermal method and, therefore, can have an Si concentration of lower than $2 \times 10^{15}$ atoms/cm$^3$. In the ammonothermal method, it is effective for a reduction of the Si concentration to use NH$_4$F singly or in combination with HX as a mineralizer(s).

The bulk crystal 10 is grown by an ammonothermal method and, therefore, can have a peak attributed to a gallium vacancy-hydrogen complex at 3,140 to 3,200 cm$^{-1}$ in an infrared absorption spectrum.

2. C-PLANE GAN WAFER

Another embodiment of the present invention encompasses: a c-plane GaN wafer obtained by a method that includes at least the step of preparing the above-described bulk GaN crystal and the step of slicing the bulk GaN crystal; and a method of producing the c-plane GaN wafer. In the step of slicing the bulk GaN crystal, it is preferred to slice the crystal substantially parallel to the c-plane. It is noted here, however, that the c-plane GaN wafer according to this embodiment is not limited to one obtained from the above-described bulk GaN crystal.

Figure 4:
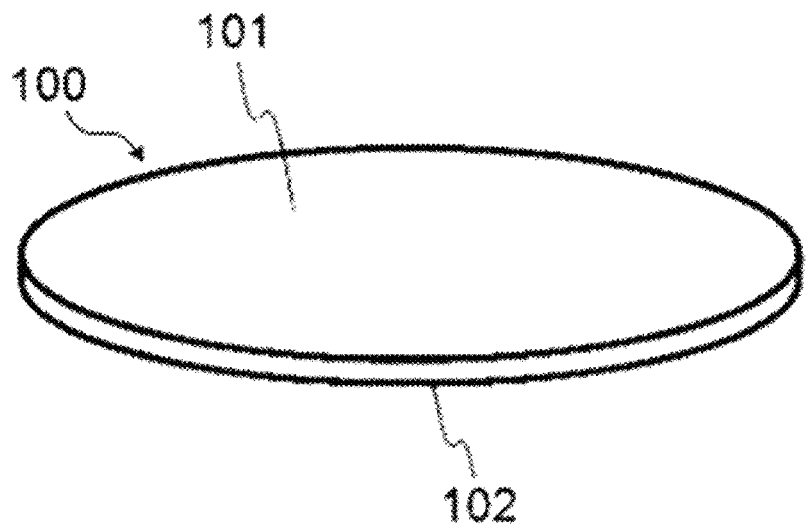
FIG. 4 is a perspective view that illustrates one example of a c-plane GaN wafer according to one embodiment.

FIG. 4 is a perspective view that illustrates one example of a c-plane GaN wafer (hereinafter, also referred to as "c-plane wafer") according to one embodiment. Referring to FIG. 4, a c-plane wafer 100 has a disk shape with two main surfaces facing the opposite direction from each other, namely a third main surface 101 and a fourth main surface 102. One of the third main surface 101 and the fourth main surface 102 is Ga-polar while the other main surface is N-polar. The third main surface 101 and the fourth main surface 102 are parallel to each other; however, they are not necessarily required to be strictly parallel to each other. The term "disk shape" used herein means a cylindrical shape in which the circle diameter (d) is greater than the height (l), and the ratio thereof (d/l) is usually 20 or higher.

The shape of the third main surface of the c-plane wafer 100 is not particularly restricted; however, it is preferred that a virtual line segment of 50 mm or longer can be drawn on this main surface. The line segment may be 75 mm or longer, 100 mm or longer, or 150 mm or longer.

The third main surface of the c-plane wafer 100 is preferably circular and, when the c-plane wafer 100 has a disk shape, the diameter of the circle constituting the disk shape (upper surface or lower surface of the disk shape) is not limited; however, it is usually 50 mm or larger and typically, for example, 50 mm to 55 mm (approximately 2 inches), 75 mm to 80 mm (approximately 3 inches), 100 mm to 105 mm (approximately 4 inches), or 150 mm to 155 mm (approximately 6 inches). The diameter of the c-plane wafer 100 may be outside of these ranges, i.e. smaller than 50 mm, larger than 55 mm but smaller than 75 mm, larger than 80 mm but smaller than 100 mm, larger than 105 mm but smaller than 150 mm, or larger than 155 mm.

Since the c-plane wafer 100 is required to have such a strength that does not cause a problem in handling, the c-plane wafer 100 usually has a thickness of not less than 250 µm and is made thicker in accordance with the diameter.

When the diameter of the c-plane wafer 100 is approximately 2 inches, the thickness is preferably 250 µm or greater, more preferably 300 µm or greater, but preferably 450 µm or less, more preferably 400 µm or less.

When the diameter of the c-plane wafer 100 is approximately 4 inches, the thickness is preferably 350 µm or greater, more preferably 400 µm or greater, but preferably 750 µm or less, more preferably 650 µm or less.

When the diameter of the c-plane wafer 100 is approximately 6 inches, the thickness is preferably 400 µm or greater, more preferably 450 µm or greater, still more preferably 550 µm or greater, but preferably 800 µm or less, more preferably 700 µm or less.

In the present specification, the term "approximately" used for the diameter of the c-plane wafer 100 means a range of within ±20%, a range of within ±10%, or a range of ±0 to +20% or ±0 to +104.

The c-plane wafer 100 can have an off-cut angle of 10° or smaller.

Figure 5:
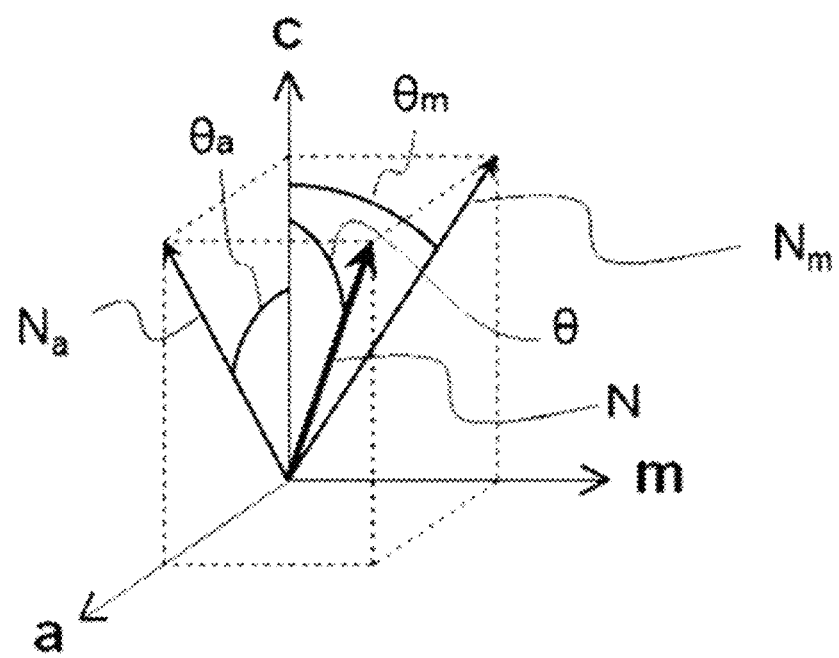
FIG. 5 is a drawing for explaining that an off-cut angle of a c-plane GaN wafer can be broken down into an m-axis direction component and an a-axis direction component.

The off-cut angle of the c-plane wafer 100 can be broken down into an m-axis direction component and an a-axis direction component. Referring to FIG. 5, when the normal vector of the third main surface 101 is a vector N, the off-cut angle of the c-plane wafer 100 is an inclination θ of the vector N from the c-axis. This vector N can be broken down into a vector $N_a$ which is an a-axis direction component, and a vector $N_m$ which is an m-axis direction component. An orthogonal projection of the vector N on the m-plane is the vector Na, and an orthogonal projection of the vector N on the a-plane is the vector Nm.

When the vector N is broken down in this manner, the inclination of the vector $N_a$ from the c-axis is an a-axis direction component $θ_a$ of the off-cut angle θ, and the inclination of the vector $N_m$ from the c-axis is an m-axis direction component $θ_R$ of the off-cut angle θ.

Since the c-plane wafer 100 is sliced from the bulk crystal 10 of the present embodiment, an off-cut angle variation of the c-plane wafer 100 in the third main surface 101 is reduced.

Specifically, in the c-plane wafer 100, a variation range of the m-axis direction component of the off-cut angle and that of the a-axis direction component of the off-cut angle in the third main surface 101 are both 0.05° or less, except for the portion having a distance of less than 5 mm from the outer circumference in a plan view. The variation range of the m-axis direction component of the off-cut angle and that of the a-axis direction component of the off-cut angle are independently preferably less than 0.05°, more preferably 0.04° or less, still more preferably 0.03° or less, yet still more preferably 0.02° or less. This preferred range may be satisfied only by only one of the above-described two variation ranges; however, it is preferably satisfied by both of the variation ranges.

This can be paraphrased as "in the c-plane wafer 100, a variation range of an arbitrary first axis direction component equivalent to the diameter of the third main surface 101 and a variation range of a second axis direction component equivalent to the diameter in the direction perpendicular to the first axis are both 0.05° or less, except for the portion having a distance of less than 5 mm from the outer circumference in a plan view". The variation range of the first axis direction component of the off-cut angle and that of the second axis direction component of the off-cut angle are independently preferably less than 0.05°, more preferably 0.04° or less, still more preferably 0.03° or less, yet still more preferably 0.020 or less. This preferred range may be satisfied only by only one of the above-described two variation ranges; however, it is preferably satisfied by both of the variation ranges.

The third main surface 101 of the c-plane wafer 100 is a "front surface" and, when a semiconductor device is produced using the c-plane wafer 100, a semiconductor layer is epitaxially grown on the third main surface 101.

A processing performed for planarizing the third main surface 101 may include at least one selected from grinding, polishing, and CMP. In addition to these processes, etching may be performed for the purpose of removing a damaged layer.

The root-mean-square (RMS) roughness of the third main surface 101, which is measured under an AFM, is preferably less than 5 nm, more preferably less than 2 nm, still more preferably less than 1 nm, and may be less than 0.5 nm, in a measurement area of 2 µm×2 µm.

The fourth main surface 102 of the c-plane wafer 100 is a "back surface", and may be a mirror-finished surface, a roughened surface, or an etched surface.

The edges of the c-plane wafer 100 may be chamfered as well, although this is not illustrated in FIG. 4. Further, as required, the c-plane wafer 100 may be provided with various markings, such as an orientation flat or notch that indicates the crystal orientation, and an index flat for making it easier to distinguish the front surface from the back surface.

The c-plane wafer 100 can be preferably used for the production of a nitride semiconductor device.

One example of a method of producing a nitride semiconductor device is a method that includes the step of preparing the above-described c-plane GaN wafer and the step of epitaxially growing at least one nitride semiconductor layer on the c-plane GaN wafer. This production method is also applicable to the production of an epitaxial wafer and, specifically, an epitaxial wafer is formed by epitaxially growing at least one nitride semiconductor layer on the third main surface of the c-plane wafer 100. As an epitaxial growth method, a vapor-phase method such as MOVPE (Metal Organic Vapor Phase Epitaxy), MBE (Molecular Beam Epitaxy), PXD (Pulsed Excitation Deposition), sputtering, or HVPE (Hydride Vapor Phase Epitaxy) can be preferably employed.

The nitride semiconductor layer to be epitaxially grown can be doped to be n-type conductive, p-type conductive, or semi-insulating.

Examples of a nitride semiconductor device that can be produced using the c-plane wafer 100 include: light-emitting devices, such as light-emitting diodes (LEDs) and laser diodes (LDs); electronic devices, such as rectifiers, bipolar transistors, field-effect transistors, and HEMTs (High Electron Mobility Transistors); semiconductor sensors, such as temperature sensors, pressure sensors, radiation sensors, and visible-ultraviolet light detectors; and solar cells.

Other use of the c-plane wafer 100 is the use as a seed for growing a bulk GaN crystal by HVPE, THVPE (Tri-Halide Vapor Phase Epitaxy), OVPE (Oxide Vapor Phase Epitaxy), an ammonothermal method, a Na flux method, or a variety of other methods.

Another embodiment of the c-plane GaN wafer is a c-plane GaN wafer having a main surface selected from a surface inclined at 0° to 10° from the (0001) crystal plane and a surface inclined at 0° to 10° from the (000-1) crystal plane, and the main surface is a specific main surface B that satisfies the following condition (iii):

(iii) on the specific main surface B, a virtual line segment of 50 mm or longer can be drawn, and a variation range of an m-axis direction component of an off-cut angle and that of an a-axis direction component of the off-cut angle are both 0.05° or less, except for the portion having a distance of less than 5 mm from the outer circumference in a plan view.

In this embodiment, from the standpoint of obtaining the effects of the present invention, the mode of the surface on the opposite side of the main surface is not particularly restricted as long as the c-plane GaN wafer has the main surface that is selected from a surface inclined at 0° to 10° from the (0001) crystal plane and a surface inclined at 0° to 10° from the (000-1) crystal plane. The surface on the opposite side of the main surface may or may not be parallel to the main surface, and may be a crystal plane other than the (0001) and (000-1) crystal planes.

In the c-plane GaN wafer of the above-described mode (hereinafter, referred to as "second mode of the c-plane GaN wafer"), one selected from a surface inclined at 0° to 10° from the (0001) crystal plane and a surface inclined at 0° to 10° from the (000-1) crystal plane is a specific main surface B, and the c-plane GaN wafer has another main surface on the opposite side of the specific main surface B.

When this main surface on the opposite side is one of the above-described two surfaces that is not selected as the specific main surface B, the mode of the above-described bulk GaN crystal is the same as the above-described mode of having the third main surface and the fourth main surface (hereinafter, referred to as "first mode of the c-plane GaN wafer"). In this case, the specific main surface B of the c-plane GaN wafer in the second mode is the third main surface in the first mode.

The constituents and characteristics of the requirements as well as the use and the like of the c-plane GaN wafer in the first mode are also applicable to the c-plane GaN wafer of the second mode in the same manner.

3. METHOD OF PRODUCING BULK GAN CRYSTAL

A method of producing the above-described bulk GaN crystal is not limited, and the bulk GaN crystal can be obtained by, for example, a production method that includes the steps of preparing the above-described c-plane GaN wafer and epitaxially growing a GaN crystal from a vapor phase on the c-plane GaN wafer, or a production method that includes the step of growing a GaN crystal by an ammonothermal method on a seed assembly constituted by plural c-plane GaN wafers. With regard to an embodiment of the above-described epitaxial growth, the embodiment described above for the c-plane GaN wafer can be applied.

A method of producing a bulk GaN crystal using a seed assembly will now be described in detail.

A major characteristic feature of the seed assembly is the use of a metal wire for immobilization of c-plane GaN wafers constituting the seed assembly with one another. Specifically, a small through-hole is formed on all of the c-plane GaN wafers, and all of the c-plane GaN wafers are each tied together with other c-plane GaN wafer by the metal wire passed through their through-holes.

The metal wire may be any metal wire that can withstand an ammonothermal environment to which it is exposed during the growth of a GaN crystal. When a halogen-containing compound is used as a mineralizer in the step of growing a GaN crystal by an ammonothermal method, a metal wire that can be preferably used is at least one selected from a Pt wire and an Au wire, and the metal wire is more preferably a Pt wire; however, the metal wire may be a W wire, a Mo wire, an Ag wire, or the like. Further, a material used for the immobilization is not limited to a metal wire as long as the material can withstand an ammonothermal environment and immobilize the c-plane GaN wafers with one another.

In one mode, the seed assembly is characterized in that the orientations of the c-axes, a-axes, and m-axes of all of the c-plane GaN wafers constituting the seed assembly are aligned. Therefore, in the process of crystal growth, GaN crystals started growing from the surfaces of different c-plane GaN wafers are successfully integrated (coalesced). This is presumed to be useful for inhibiting the generation of detrimental stress. It is noted here that a phrase "the orientations of the c-axes, a-axes, and m-axes of c-plane GaN wafers are aligned" means that the orientations of the polarities of the c-plane GaN wafers are also aligned.

When the front and the back of the seed assembly are defined assuming that the N-polar-side main surfaces of the c-plane GaN wafers constituting the seed assembly are facing the front side of the seed assembly, two or more c-plane GaN wafers each having a rectangular or substantially rectangular main surface are adjacently arranged on the front side of the seed assembly. When the direction of the N-polar side of the main surfaces of the c-plane GaN wafers constituting the seed assembly is defined as front direction, the seed assembly can be described as two or more c-plane GaN wafers each having a rectangular or substantially rectangular main surface on the front-direction side of the seed assembly.

It is preferred that the adjacently arranged two or more c-plane GaN wafers do not have any gap therebetween. The term "gap" used herein means such a gap that can be visually confirmed, and it is more preferred that the c-plane GaN wafers be adjacently arranged in a manner that there is no gap at a level of being observed under a light microscope.

The two or more c-plane GaN wafers are preferably sliced parallel to one another from the same bulk GaN crystal. Specifically, the two or more c-plane GaN wafers may be parallelly cut out from a single slice of a bulk GaN crystal, or may be parallelly cut out from different slices of a bulk GaN crystal. In the case of cutting out c-plane GaN wafers from different slices of a bulk GaN crystal, it is preferred to cut out two or more c-plane GaN wafers in the direction that they are parallel to each other in the original bulk GaN crystal. For example, it is also preferred to cut out two or more c-plane GaN wafers different in the thickness direction at the same position in the original bulk GaN crystal and to construct the seed assembly by combining these c-plane GaN wafers. In this case, the cutting does not have to be performed at completely the same position, and c-plane GaN wafers may be cut out such that there is at least a position where the c-plane GaN wafers overlap with one another in the thickness direction.

When obtaining c-plane GaN wafers by any of the above-described methods, it is important that the crystal orientations of the c-plane GaN wafers be aligned with each other. Specifically, the seed assembly is obtained by combining c-plane GaN wafers in which a misalignment in the a-axis direction and that in the m-axis direction are independently usually less than 0.05°, preferably less than 0.02°, more preferably less than 0.01°, still more preferably less than 0.005°. The directions of the crystallographic axes of the c-plane GaN wafers can be measured by XRD.

On the back side (the opposite direction of the above-described front direction) of the seed assembly, a c-plane GaN wafer that plays a role of a connecting plate is arranged.

A method of parallelly arranging plural wafers as a seed assembly and producing a GaN crystal on the surface of the seed assembly has been commonly employed for vapor-phase growth such as HVPE. This is because the seed assembly can be firmly immobilized on a susceptor in a production method such as HVPE. On the other hand, in an ammonothermal method, a seed assembly is in a state of being suspended by a wire in a liquid such as ammonia; therefore, even when plural wafers are parallelly arranged to integrate them as a seed assembly, it is difficult to immobilize the wafers with one another. Because of this problem, conventionally, a tile method has not been employed in an ammonothermal method; however, as described above, this problem can be solved by immobilizing the wafers using a wire.

Figure 6:
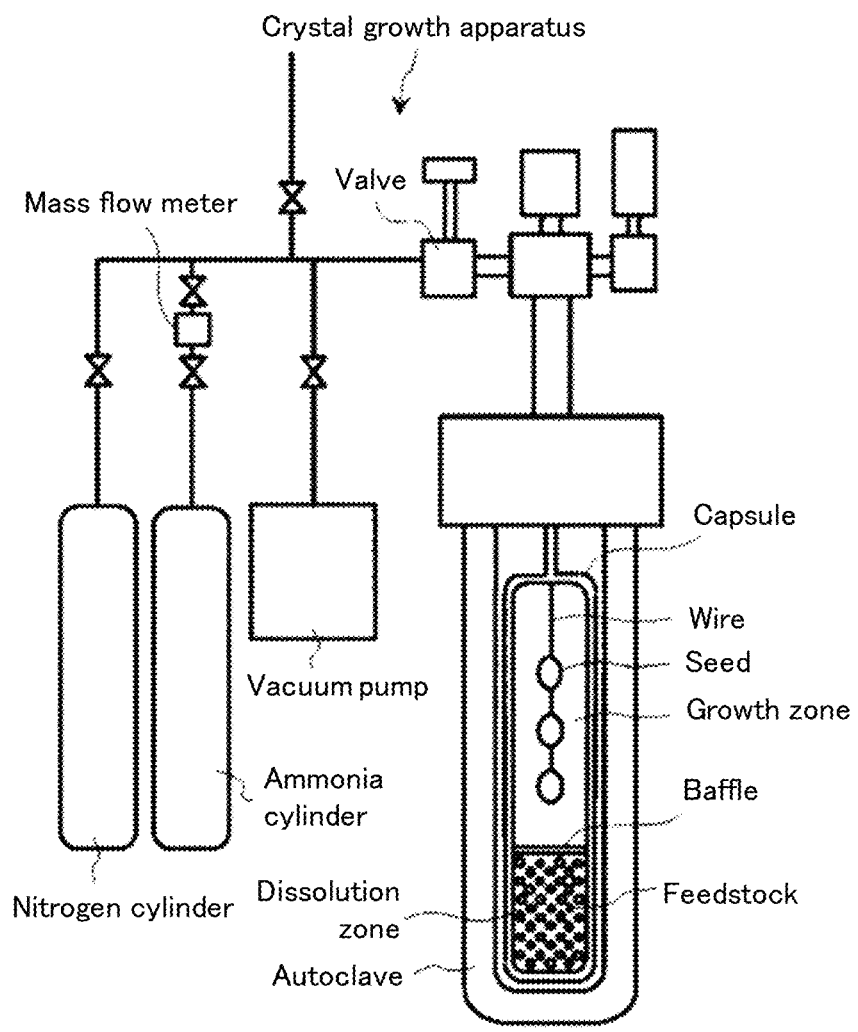
FIG. 6 is a schematic drawing that illustrates a crystal growth apparatus that can be preferably used for growing a GaN crystal by an ammonothermal method.

The crystal growth apparatus illustrated in FIG. 6 can be preferably used for growing a GaN crystal by an ammonothermal method.

Referring to FIG. 6, the crystal growth apparatus includes an autoclave, and a capsule arranged therein. Inside the capsule, a dissolution zone and a growth zone, which are partitioned from each other by a baffle, are arranged. When growing a GaN crystal, a feedstock is placed in the dissolution zone along with a mineralizer (not illustrated), and a seed is suspended by a wire in the growth zone.

A gas line to which a vacuum pump, an ammonia cylinder, and a nitrogen cylinder are connected is connected to the autoclave and the capsule via a valve.

When $NH_3$ (ammonia) is introduced into the capsule, the amount of $NH_3$ supplied from the ammonia cylinder can be checked by a mass flow meter.

The pressure inside the capsule upon heating of the capsule to a prescribed temperature is determined in accordance with the free volume of the capsule and the amount of $NH_3$ introduced into the capsule.

When growing GaN, a seed, a feedstock, a mineralizer, and $NH_3$ are placed in the capsule. The capsule is hermetically sealed and then heated by heaters (not illustrated) from outside of an autoclave such that a supercritical state is established inside the capsule. In this process, $NH_3$ is entrapped not only inside the capsule but also in the space between the autoclave and the capsule such that the pressure is balanced between the inside and the outside of the capsule.

In order to create a temperature gradient between the dissolution zone and the growth zone, the upper part and the lower part of the autoclave are separately heated by plural heaters.

When a halogen-containing compound such as HX, $NH_4X$, or $GaX_3$ (wherein, X=F, Cl, Br, or I) is used as the mineralizer, the materials of the capsule, a baffle and a jig that are arranged inside the capsule, and the wire used for suspending the seed are preferably Pt (platinum) or an alloy containing Pt as a main component. Particularly, the capsule is preferably formed of a Pt—Ir alloy.

Figure 7:
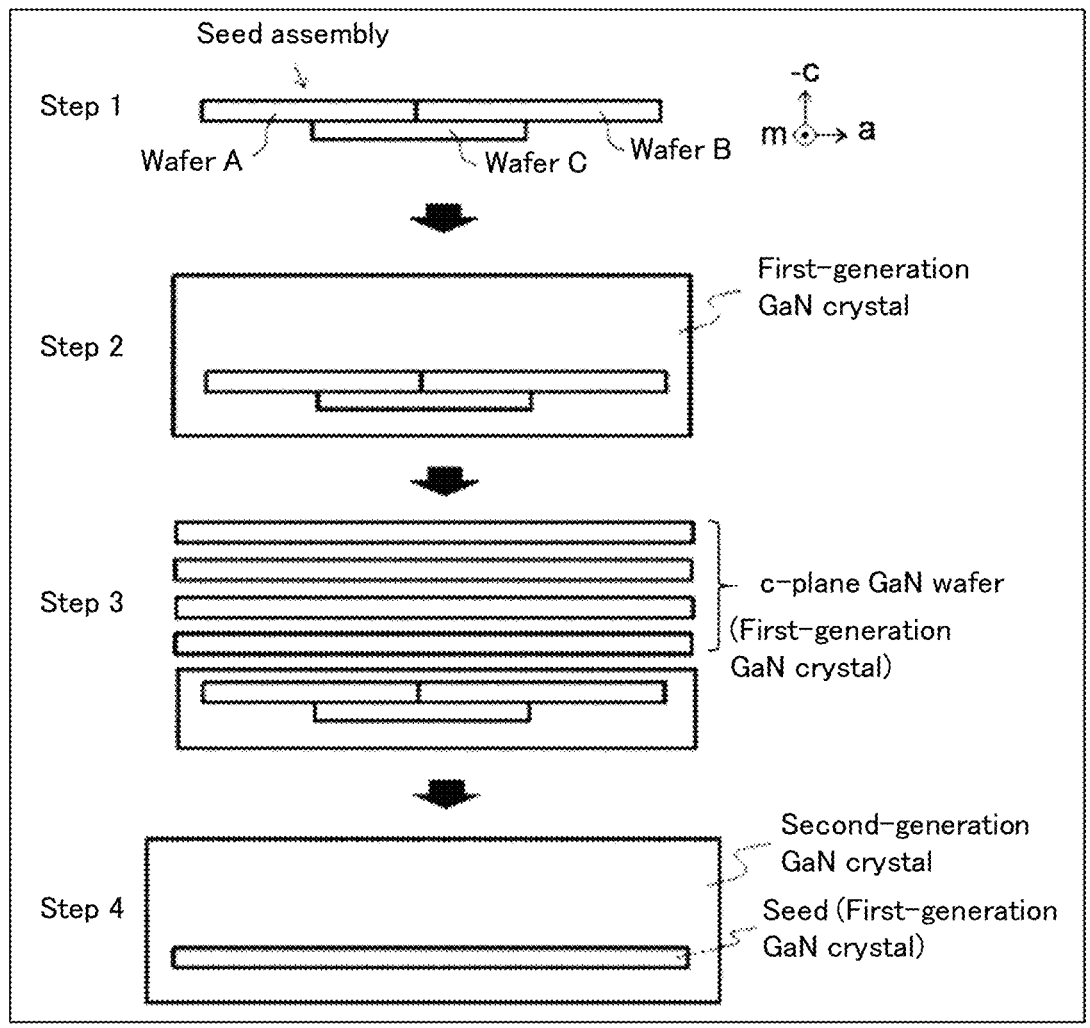
FIG. 7 illustrates the steps performed in an experiment of producing a large-surface-area bulk GaN crystal.

4. EXPERIMENTAL RESULTS 4.1. Production of Large-Surface-Area Bulk GaN Crystal A large-surface-area bulk GaN crystal was produced by sequentially executing the steps 1 to 4 as illustrated in FIG. 7. The term "large-surface-area" used herein is not limited to a specific area; however, specifically, the bulk GaN crystal has a size in which two 80 mm-long virtual line segments perpendicular to each other can be drawn on a main surface. The steps are summarized as follows.

In the step 1, a seed assembly was prepared.

In the step 2, a first-generation GaN crystal was grown on the seed assembly.

In the step 3, a c-plane GaN wafer was sliced from a portion of the first-generation GaN crystal grown on the front side of the seed assembly.

In the step 4, a second-generation GaN crystal was grown on the c-plane GaN wafer sliced in the step 3.

In the experiment described below, a crystal growth apparatus of the type illustrated in FIG. 6 was used for growing a GaN crystal by an ammonothermal method.

The steps will now each be described in detail.

[Step 1]

In the step 1, a seed assembly was prepared by the below-described procedures.

a. Growth of Seed GaN Crystal

A c-plane GaN wafer of 4 inches in diameter, which was made of a GaN crystal grown on a sapphire substrate by an HVPE method and had a mirror-finished and planarized N-polar surface (this c-plane GaN wafer is hereinafter referred to as "HVPE wafer"), was prepared. The "N-polar surface" refers to a main surface on the [000-1] side.

On the N-polar surface of the HVPE wafer, a stripe-patterned selective growth mask, which was made of a sputtered film having a bilayer structure in which a 100 nm-thick Pt surface layer was laminated on a 100 nm-thick TiW underlayer, was formed by a lift-off method.

Linear openings formed on the selective growth mask had a line width of 50 μm, and the pitch between the linear openings was 4 mm. The stripe direction was parallel to the a-plane of the GaN crystal constituting the HVPE wafer.

After the formation of the selective growth mask, a GaN crystal was grown on the HVPE wafer by an ammonothermal method. As a feedstock, a polycrystalline GaN, which was produced by a method of bringing an HCl gas into contact with simple Ga under heating to generate gaseous GaCl and subsequently allowing this gaseous GaCl to react with an $NH_3$ gas, was used. As mineralizers, $NH_4F$ and $NH_4I$ were used. $NH_4I$ was synthesized by allowing an HI (hydrogen iodide) gas and $NH_3$ to react with each other in the capsule.

The molar ratios of F and I contained in the mineralizers with respect to $NH_3$ used as a solvent were 0.5% and 4.0%, respectively.

As for the growth conditions, the temperature $T_D$ of the dissolution zone and the temperature $T_G$ of the growth zone had an average value of 600° C.; a temperature difference between these zones, $T_D$-$T_G$ ($T_D$>$T_G$), was approximately 5° C.; and the pressure was approximately 220 MPa.

On the N-polar surface of the HVPE wafer, a GaN crystal was grown in the form of layers through the above-described selective growth mask. A c-plane GaN wafer was sliced from this GaN crystal and used as a seed to grow a new GaN crystal by an ammonothermal method.

When the c-plane GaN wafer grown by an ammonothermal method was used as a seed, the selective growth mask was not used, and the molar ratio of F and I contained in the mineralizers with respect to $NH_3$ were set at 5.0% and 3.5%, respectively.

As for the growth conditions with the use of the c-plane GaN wafer grown by an ammonothermal method as a seed, the temperature $T_D$ of the dissolution zone and the temperature $T_G$ of the growth zone had at an average value of 605 to 615° C.; a temperature difference between these zones, $T_D$-$T_G$ ($T_D$>$T_G$), was approximately 15 to 20° C.; and the pressure was approximately 210 to 220 MPa.

b. Construction of Seed Assembly

From a single bulk GaN crystal grown by the procedures described in the section a. above, plural c-plane wafers were sliced parallel to one another using a multi-wire saw, and three of the thus obtained plural c-plane wafers were selected. The selected three wafers were, after verification of their crystal orientations using an X-ray diffractometer, subjected to a processing in which the edges were partially cut off using a dicing saw such that the resulting wafers each had a rectangular or substantially rectangular main surface, whereby wafers A to C shown in Table 1 below were prepared.

TABLE 1

| | Thickness [μm] | Orientation of main surface | Shape of main surface | Dimensions of main surface [mm] | |
|---|---|---|---|---|---|
| | | | | Long-side direction | Short-side direction |
| Wafer A | 620 | c-axis | substantially rectangular | 98 | 39 |
| Wafer B | 620 | c-axis | substantially rectangular | 98 | 41 |
| Wafer C | 620 | c-axis | rectangular | 96 | 35 |

In the preparation of the wafer A, the dicing saw processing was performed such that one of the long sides of the substantially rectangular main surface was oriented at ±0.005° or less from the m-axis direction.

The same dicing saw processing was also performed in the preparation of the wafer B.

Subsequently, a temporary seed assembly illustrated in FIG. 8 was constructed by immobilizing the wafers A, B and C with one another using a wax as an adhesive.

Figure 8:
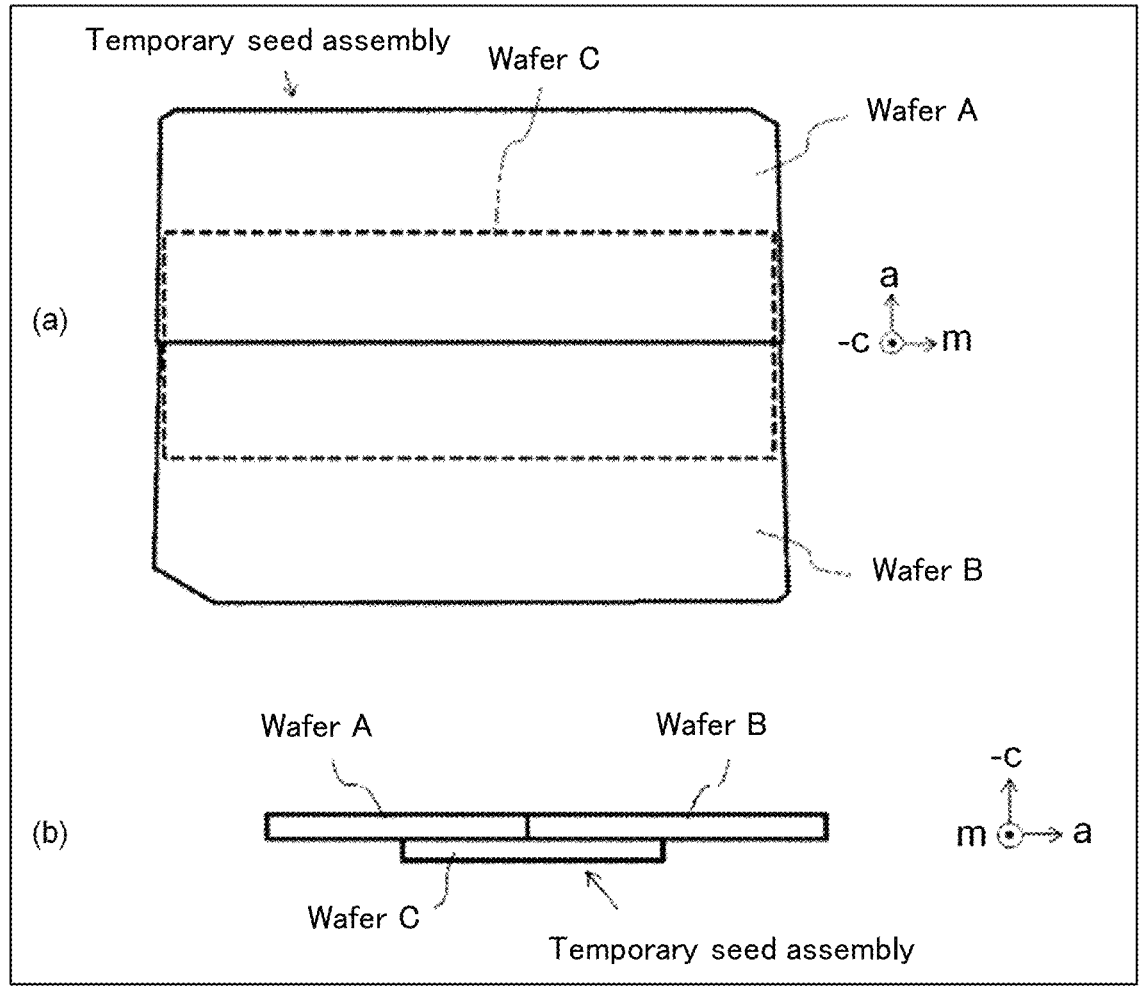
FIG. 8 Panel (a) of FIG. 8 is a plan view of a temporary seed assembly, and Panel (b) of FIG. 8 is a side view of the temporary seed assembly illustrated in Panel (a) of FIG. 8.

Panel (a) of FIG. 8 is a plan view of the temporary seed assembly taken from the front side, and Panel (b) of FIG. 8 is a side view of the temporary seed assembly taken from the direction parallel to the long sides of the wafer A. In the present experiment, the side to which the main surfaces of the wafers A to C on the N-polar side were oriented is referred to as "front side" of the temporary seed assembly. The orientations of the c-axes, a-axes, and m-axes of the three wafers A to C were aligned, including the polarity.

The wafers A and B were arranged on the front side of the temporary seed assembly such that their long sides, which had been processed to be oriented at ±0.005° or less from the m-axis direction, were placed adjacent to each other without any visually recognizable gap therebetween. The wafer C was arranged on the back side of the temporary seed assembly such that one half of the wafer C overlapped with the wafer A while the other half overlapped with the wafer B.

Figure 9:
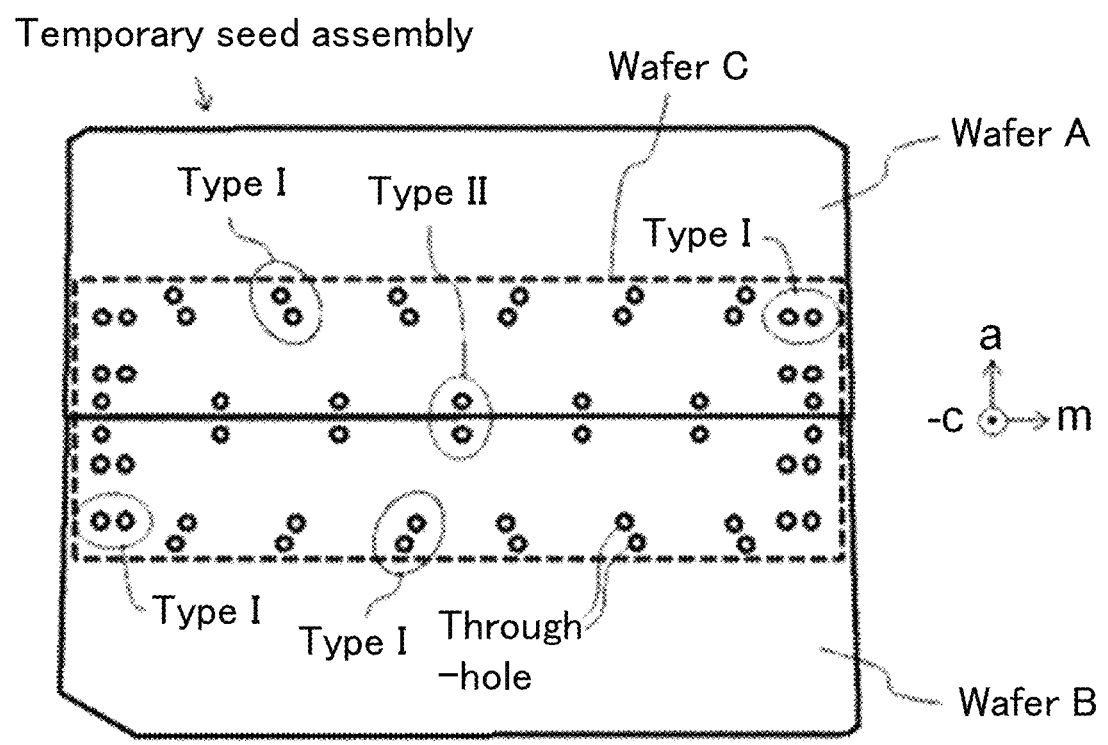
FIG. 9 is a plan view of a temporary seed assembly on which plural through-holes are formed.

Next, using an ultrasonic drill having a diameter of 0.7 mm, plural through-holes were formed on the temporary seed assembly as illustrated in FIG. 9.

All of the plural through-holes penetrated through two wafers. That is, the through-holes formed in the portion where the wafers A and C overlapped with each other penetrated through the wafers A and C, and the through-holes formed in the portion where the wafers B and C overlapped with each other penetrated through the wafers B and C.

The plural through-holes were arranged such that they each formed a pair with another through-hole, and the distance between the central axes of two through-holes forming a pair was set at 2 mm for type I through-hole pairs, or 4 mm for type II through-hole pairs.

It is noted here that a "type I through-hole pair" refers to a through-hole pair in which the two through-holes forming the pair both penetrate through the wafers A and C or the wafers B and C, and a "type II through-hole pair" refers to a through-hole pair in which one of the two through-holes forming the pair penetrates through the wafers A and C while the other through-hole penetrates through the wafers B and C.

In a plan view of the temporary seed assembly, straight lines connecting the central axes of the two through-holes forming the respective type I through-hole pairs were parallel to the <10-10> crystallographic axis, and straight lines connecting the central axes of the two through-holes forming the respective type II through-hole pairs were perpendicular to the boundary between the wafers A and B.

In this step, a through-hole required for suspending the later-formed permanent seed assembly in the capsule was also formed in addition to the above-described through-holes; however, illustration thereof is omitted in FIG. 9.

After the formation of the through-holes, the temporary seed assembly was disassembled by heat-melting the wax used for adhesion. The wax adhering to the wafers A, B and C was wiped off, and the wafers A, B and C were subsequently etched with a 48%, aqueous KOH solution heated to 100° C. for the removal of damaged layer.

Thereafter, a permanent seed assembly was constructed by immobilizing the wafers A, B and C with one another in the same arrangement as in the temporary seed assembly.

In the construction of the permanent seed assembly, for each through-hole pair, one end and the other end of a Pt wire having a diameter of 0.2 mm was passed through the respective through-holes forming the pair from the front side and twisted together on the back side. It is noted here that the side to which the main surfaces of the wafers A to C on the N-polar side were oriented is referred to as "front side" of the permanent seed assembly.

Figure 10:
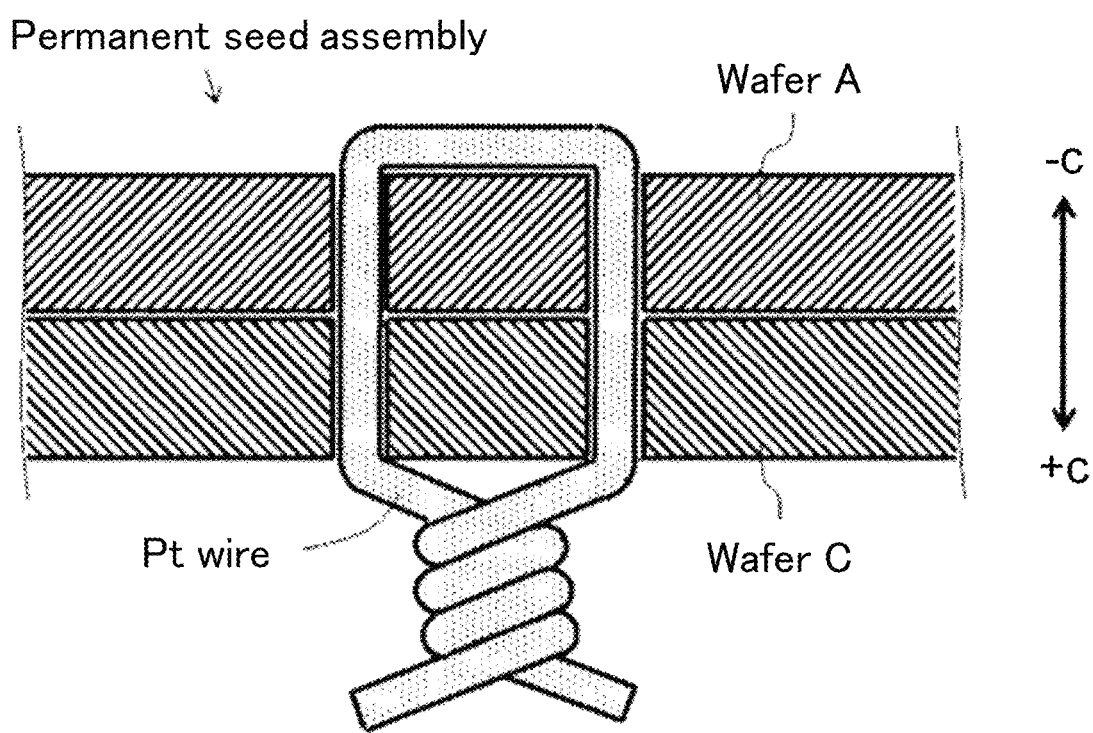
FIG. 10 is a cross-sectional view that illustrates a type I through-hole pair in which one end and the other end of a Pt wire are passed through the respective through-holes from the front side of a permanent seed assembly and twisted together on the back side.

FIG. 10, which is provided as one example, is a cross-sectional view of a type I through-hole pair formed in the portion where the wafers A and C are overlapping with each other, and illustrates a state that one end and the other end of a Pt wire are passed through the respective through-holes from the front side and twisted together on the back side as described above.

Figure 11:
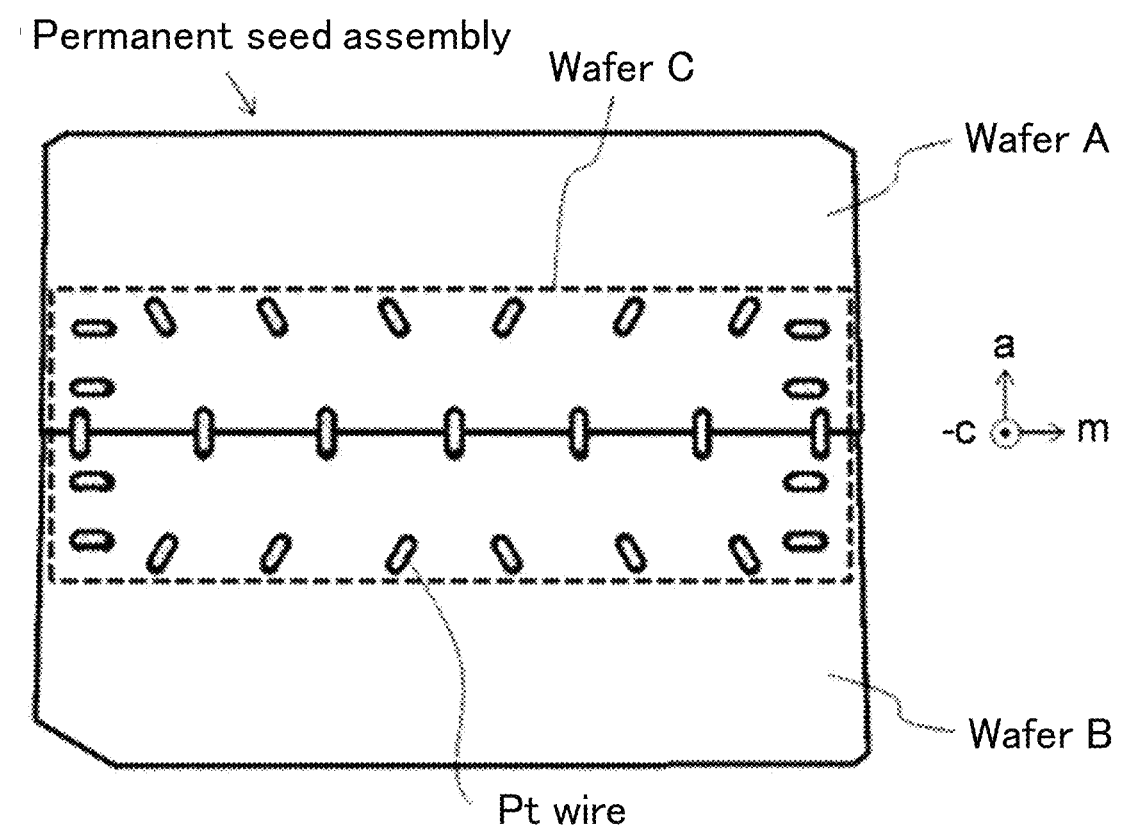
FIG. 11 is a plan view of a permanent seed assembly.

FIG. 11 is a plan view of a completed permanent seed assembly taken from the front side. In FIG. 11, the wafer C whose outline is drawn with a dashed line is arranged on the back side of the seed assembly and plays a role of a connecting plate that connects the wafer A and the wafer B.

[Step 2]

In the step 2, a first-generation GaN crystal was grown on the permanent seed assembly (hereinafter, simply referred to as "seed assembly") by an ammonothermal method in the following manner.

As a feedstock, a polycrystalline GaN, which was produced by a method of bringing an HCl gas into contact with simple Ga under heating to generate gaseous GaCl and subsequently allowing this gaseous GaCl to react with an $NH_3$ gas, was used. As mineralizers, $NH_4F$ and $NH_4I$ were used. $NH_4I$ was synthesized by allowing an HI (hydrogen iodide) gas and $NH_3$ to react with each other in the Pt—Ir capsule.

The molar ratios of F and I contained in the mineralizers with respect to $NH_3$ used as a solvent were 5.0% and 3.5%, respectively.

As for the growth conditions of the first-generation GaN crystal, the temperature $T_D$ of the dissolution zone and the temperature $T_G$ of the growth zone had an average value of approximately 605 to 615° C.; a temperature difference between these zones, $T_D$-$T_G$ ($T_D$>$T_G$), was approximately 15 to 20° C.; and the pressure inside the capsule was approximately 210 to 220 MPa.

The thus grown first-generation GaN crystal was entirely transparent despite enclosing the whole seed assembly inside; therefore, it was confirmed by visual observation that there was no trace of abnormal growth caused by any of the through-holes formed on the c-plane GaN wafers constituting the seed or the PT wires passed through the through-holes.

[Step 3]

As described above, the first-generation GaN crystal grown in the step 2 enclosed the whole seed assembly inside and, from a portion of this first-generation GaN crystal that was grown on the front side of the seed assembly, plural c-plane wafers were sliced using a wire saw.

[Step 4]

In the step 4, a second-generation GaN crystal was grown by an ammonothermal method using one of the c-plane GaN wafers sliced in the step 3 as a seed to produce a large-surface-area bulk GaN crystal containing the seed inside.

In the growth of the second-generation GaN crystal, a feedstock that was used and the molar ratios of F and I contained in mineralizers with respect to $NH_3$ used as a solvent were the same as in the growth of the first-generation GaN crystal. In addition, the growth conditions were also the same as in the growth of the first-generation GaN crystal.

Figure 12:
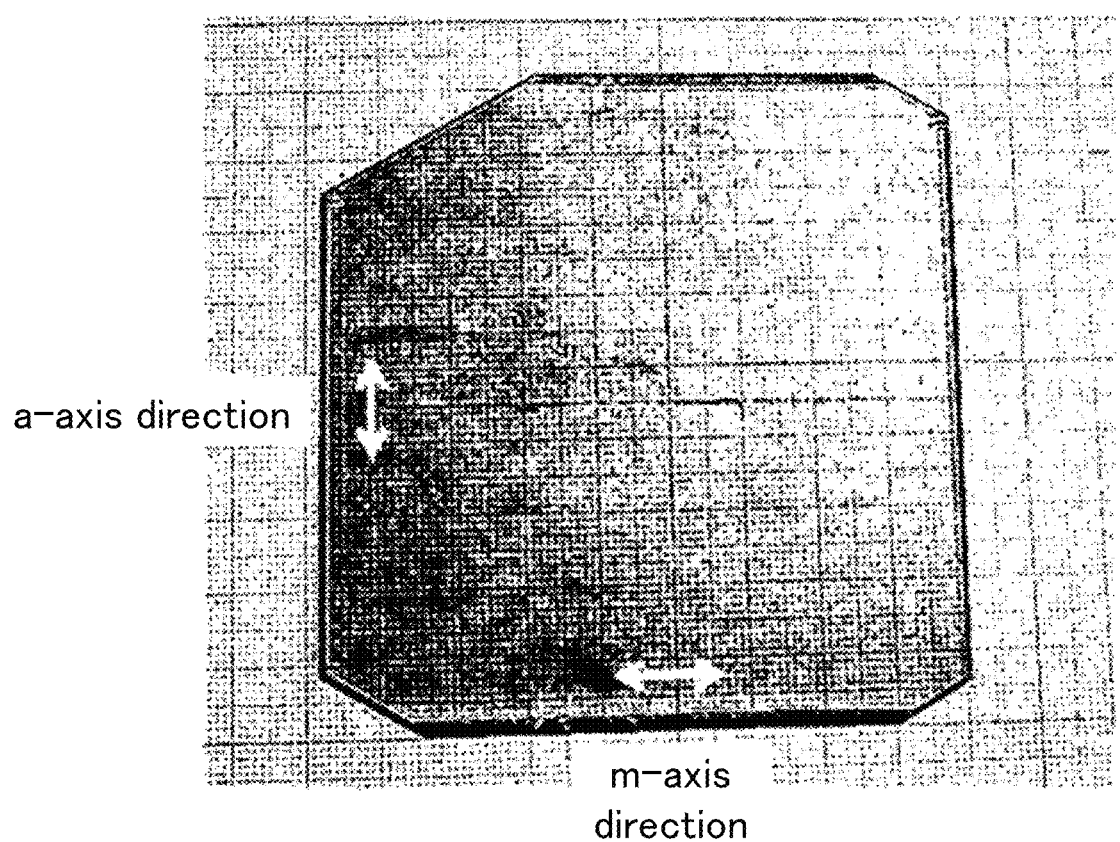
FIG. 12 is a photograph (drawing substitute) showing the outer appearance of a large-surface-area bulk GaN crystal viewed from the N-polar side.

FIG. 12 shows the outer appearance of the thus obtained large-surface-area bulk GaN crystal viewed from the N-polar side. This crystal was a plate-like crystal having a main surface oriented with the c-axis, and had a thickness of 2.93 mm including the seed contained inside. The main surface had a shape in which the four corners were cut off from a square having two sides substantially parallel to the m-axis and the other two sides substantially parallel to the a-axis. The total width of the crystal was 8.8 cm along the direction indicated as "m-axis direction" in FIG. 12, and 9.1 cm along the direction indicated as "a-axis direction" in FIG. 12. The main surface had an area that could fit a circle of 7.5 cm in diameter (area=approximately 44 $cm^2$) with a margin.

4.2. Evaluation of Large-Surface-Area Bulk GaN Crystal

In order to evaluate the degree of curvature of the c-plane in the large-surface-area bulk GaN crystal obtained in the section 4.1. above, XRD rocking curve measurement using the (002) crystal plane as a reflection surface was performed on the N-polar side of the crystal at 5-mm intervals over a length of 80 mm along a line that was a virtual line segment passing through substantially the center of the main surface. Accordingly, the number of measurement points on a single line was 17.

As an X-ray diffractometer for the measurement, PANA-LYTICAL X'Part PRO manufactured by Spectris Co., Ltd. was used. The Cu-Kα radiation source provided in this diffractometer was operated at 30 kV and 10 mA, and Cu-Kαi radiation was obtained using a Ge(220) hybrid monochromator.

The measurement was performed along each of a first line that was a virtual line segment perpendicular to the a-axis and substantially parallel to the direction indicated as "m-axis direction" in FIG. 12, and a second line that was a virtual line segment perpendicular to the first line.

In the measurement on the first line, the omega axis was perpendicular to the first line, and the X-ray incidence plane was parallel to the first line. In the measurement on the second line, the omega axis was perpendicular to the second line, and the X-ray incidence plane was parallel to the second line.

Figure 13:
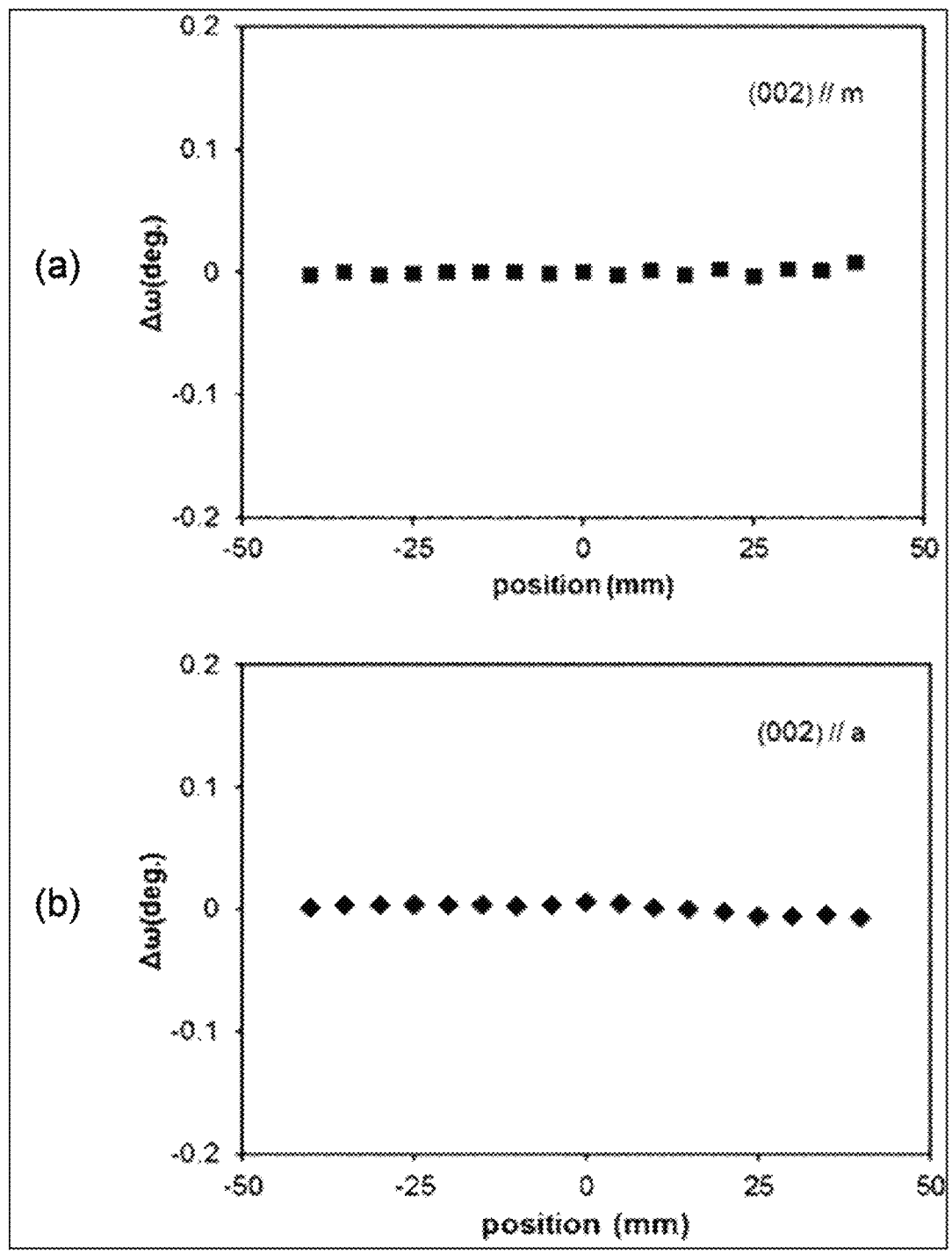
FIG. 13 Panels (a) and (b) of FIG. 13 are graphs showing the results of measuring the peak angles of (002) XRD rocking curves of a large-surface-area bulk GaN crystal at 5-mm intervals over a length of 80 mm along a first line and a second line, respectively.

Panel (a) of FIG. 13 shows the measurement results on the first line, and Panel (b) of FIG. 13 shows the measurement results on the second line.

In both Panels (a) and (b) of FIG. 13, the abscissa represents the relative positions of the respective measurement points, taking the measurement point in the middle as an origin, i.e. the distance from the origin, while the ordinate represents the difference $\Delta\omega$ ($=\omega-\omega_{AVE}$) between the peak angle ω of the rocking curve obtained at each measurement point and the average value $\omega_{AVE}$ of the peak angles at all of the 17 measurement points.

The variation range of Δω was extremely small on both of the first and the second lines, and the difference between the maximum value and the minimum value of Δω among the 17 measurement points was 0.012° on both of the lines. As understood from the definition of Δω, the difference between the maximum value and the minimum value of Δω is the same as the difference between the maximum value and the minimum value of the peak angle ω of the rocking curves.

Further, a portion where the absolute value of a difference in the rocking curve peak angle was 0.01° or larger between two adjacent measurement points was found on neither the first line nor the second line. The maximum value (absolute value) of the difference in the rocking curve peak angle between two adjacent measurement points was 0.007° on the first line and 0.004° on the second line.

As shown in Panels (a) and (b) of FIG. 13, a monotonically increasing or decreasing tendency of Δω was observed on neither the first line nor the second line, and the radius of curvature of the c-plane, which was calculated from the Δω change rage linearly approximated by least-squares method, was 1,050 m on the first line and 450 m on the second line.

By slicing the large-surface-area bulk GaN crystal produced in the section 4.1. above along the c-plane, a c-plane GaN wafer of approximately 2 inches (50 to 55 mm) to approximately 3 inches (75 to 80 mm) in diameter, in which variation ranges of the m-axis and a-axis direction components of off-cut angle are both 0.012° or less in the main surface, can be obtained.

It is noted here that, according to the results obtained by measuring GaN crystals grown by a similar or equivalent method, in all of 100 μm×100 μm regions on the main surface of the large-surface-area bulk GaN crystal produced in the section 4.1. above, the dislocation density calculated from the number of dislocations existing in each region and the area of the region is lower than $1×10^6$ $cm^{-2}$ at the highest estimate. Further, in all of 2 mm×2 mm regions as well, the dislocation density calculated from the number of dislocations existing in each region and the area of the region is lower than $1×10^5$ $cm^{-2}$ at the highest estimate.

As indicated by the evaluation results, the large-surface-area bulk GaN crystal produced in the section 4.1. above had a largely improved curvature of the c-plane while having such a large area of approximately 9 cm in both length and width. This indicates that the seed assembly according to the technical idea of the present inventors is useful as a means for increasing the surface area of a GaN crystal grown thereon without causing a stress.

In addition, it is also a noteworthy result that, despite two c-plane GaN wafers were arranged on the front side of the seed assembly, a distinct jump in the tilt of the c-axis was not observed in the large-surface-area bulk GaN crystal containing inside a GaN crystal grown on the seed assembly.

A detailed mechanism that yielded these results is not clear; however, it is considered possible that the growing GaN crystals were spontaneously aligned. For example, in the ammonothermal process, the surface of the seed assembly was dissolved at the stage before the growth zone reached a supersaturated state; therefore, the Pt wires were relaxed as the through-holes expanded in this process, and this might have caused spontaneous deformation of the seed assembly such that the stress on the growing GaN crystal was minimized.

Rationally thinking, it can be said that the preferred effects obtained by the use of the seed assembly would not be markedly hindered even with an increase in the area of the GaN wafers constituting the seed assembly or an increase in the number of GaN wafers constituting the seed assembly.

Therefore, by expanding the area of the GaN wafers constituting the seed assembly and/or increasing the number of the GaN wafers constituting the seed assembly, it is also possible to produce a large-surface-area bulk GaN crystal having length and width dimensions of approximately 4 inches (100 to 105 mm), or even approximately 6 inches (150 to 155 mm), with a quality equivalent to that of the large-surface-area bulk GaN crystal produced in the above-described experiment.

The present invention has been described based on concrete embodiments; however, these embodiments were presented as examples and should not limit the scope of the present invention. The embodiments described herein can each be variously modified without departing from the spirit of the present invention and, where feasible, may be combined with any feature described by another embodiment.

DESCRIPTION OF SYMBOLS

10: bulk crystal
11: first main surface
12: second main surface
100: c-plane wafer
101: third main surface
102: fourth main surface

The invention claimed is:

1. A bulk GaN crystal, comprising a main surface selected from a surface inclined at 0° to 10° from the (0001) crystal plane and a surface inclined at 0° to 10° from the (000-1) crystal plane,
   wherein the main surface is a specific main surface A that satisfies the following conditions (i) and (ii):
   (i) a first line, which is a 80 mm-long virtual line segment extending in a first direction on the specific main surface A, can be drawn, and a difference between a maximum value and a minimum value of peak angles in (002) XRD rocking curves of the GaN crystal, which is measured between 17 measurement points arranged at a 5-mm pitch on the first line with the omega axis being perpendicular to the first direction, is 0.05° or less; and
   (ii) a second line, which is a 80 mm-long virtual line segment extending in a second direction perpendicular to the first direction on the specific main surface A, can be drawn, and a difference between a maximum value and a minimum value of peak angles in (002) XRD rocking curves of the GaN crystal, which is measured between 17 measurement points arranged at a 5-mm pitch on the second line with the omega axis being perpendicular to the second direction, is 0.05° or less.

2. A bulk GaN crystal, comprising a first main surface and a second main surface that face the opposite direction from each other,
   wherein
   one of the first main surface and the second main surface is a surface inclined at 0° to 10° from the (0001) crystal plane while the other is a surface inclined at 0° to 10° from the (000-1) crystal plane, and
   the bulk GaN crystal satisfies the following conditions (i) and (ii):
   (i) a first line, which is a 80 mm-long virtual line segment extending in a first direction on the first main surface, can be drawn, and a difference between a maximum value and a minimum value of peak angles in (002)

XRD rocking curves of the GaN crystal, which is measured between 17 measurement points arranged at a 5-mm pitch on the first line with the omega axis being perpendicular to the first direction, is 0.05° or less; and (ii) a second line, which is a 80 mm-long virtual line segment extending in a second direction perpendicular to the first direction on the first main surface, can be drawn, and a difference between a maximum value and a minimum value of peak angles in (002) XRD rocking curves of the GaN crystal, which is measured between 17 measurement points arranged at a 5-mm pitch on the second line with the omega axis being perpendicular to the second direction, is 0.050 or less.

3. The bulk GaN crystal according to claim 1, wherein the difference between the maximum value and the minimum value of the peak angles in the condition (i) and the difference between the maximum value and the minimum value of the peak angles in the condition (ii) are both 0.02° or less.

4. The bulk GaN crystal according to claim 1, wherein neither the 17 measurement points in the condition (i) nor the 17 measurement points in the condition (ii) includes a measurement point at which the peak angle is different by 0.01° or more from the peak angle at an adjacent measurement point.

5. The bulk GaN crystal according to claim 1, wherein the radius of curvature of the surface along the first direction, which is calculated from a rate of peak angle change in the condition (i), and the radius of curvature of the surface along the second direction, which is calculated from a rate of peak angle change in the condition (ii), are both 300 m or larger.

6. The bulk GaN crystal according to claim 1, having a dislocation density of lower than $1\times10^6$ cm$^{-2}$ in all of 100 μm×100 μm virtual regions that can be arbitrarily arranged on the specific main surface A, except for the portion having a distance of less than 5 mm from the outer circumference in a plan view.

7. The bulk GaN crystal according to claim 1, having a dislocation density of lower than $1\times10^5$ cm$^{-2}$ in all of 2 mm×2 mm virtual regions that can be arbitrarily arranged on the specific main surface A, except for the portion having a distance of less than 5 mm from the outer circumference in a plan view.

8. The bulk GaN crystal according to claim 2, having a dislocation density of lower than $1\times10^6$ cm$^{-2}$ in all of 100 μm×100 μm virtual regions that can be arbitrarily arranged on the first main surface, except for the portion having a distance of less than 5 mm from the outer circumference in a plan view, which dislocation density is calculated from the number of dislocations existing in each region and the area of the region.

9. The bulk GaN crystal according to claim 2, having a dislocation density of lower than $1\times10^5$ cm$^{-2}$ in all of 2 mm×2 mm virtual regions that can be arbitrarily arranged on the first main surface, except for the portion having a distance of less than 5 mm from the outer circumference in a plan view, which dislocation density is calculated from the number of dislocations existing in each region and the area of the region.

10. The bulk GaN crystal according to claim 1, satisfying one or more conditions selected from the following (a) to (g):
(a) the H concentration is $1\times10^{17}$ atoms/cm$^3$ or higher;
(b) the O concentration is $1\times10^{17}$ atoms/cm$^3$ or higher;
(c) the concentration of at least one of Li, Na, and K is lower than $1\times10^{15}$ atoms/cm$^3$;
(d) the F concentration is $1\times10^{15}$ atoms/cm$^3$ or higher;
(e) the concentration of at least one of Cl, Br, and I is $1\times10^{15}$ atoms/cm$^3$ or higher;
(f) the I concentration is $1\times10^{15}$ atoms/cm$^3$ or higher; and
(g) the Si concentration is lower than $2\times10^{15}$ atoms/cm$^3$.

11. The bulk GaN crystal according to claim 9, having a peak attributed to a gallium vacancy-hydrogen complex at 3,140 to 3,200 cm$^{-1}$ in an infrared absorption spectrum.

12. A method of producing a c-plane GaN wafer, the method comprising at least the steps of:
preparing the bulk GaN crystal according to claim 1; and
slicing the GaN crystal.

13. The method according to claim 12, wherein
the c-plane GaN wafer has a disk shape, and
a circle constituting the disk shape has a diameter of 50 mm or larger.

14. A c-plane GaN wafer, comprising a main surface selected from a surface inclined at 0° to 10° from the (0001) crystal plane and a surface inclined at 0° to 10° from the (000-1) crystal plane,
wherein the main surface is a specific main surface B that satisfies the following condition (iii):
(iii) on the specific main surface B, a virtual line segment of 50 mm or longer can be drawn, and a variation range of an m-axis direction component of an off-cut angle and that of an a-axis direction component of the off-cut angle are both 0.05° or less, except for the portion having a distance of less than 5 mm from the outer circumference in a plan view.

15. A c-plane GaN wafer, comprising a third main surface and a fourth main surface that face the opposite direction from each other, one of which third main surface and fourth main surface is a surface inclined at 0° to 10° from the (0001) crystal plane while the other is a surface inclined at 0° to 10° from the (000-1) crystal plane,
wherein, on the third main surface, a virtual line segment of 50 mm or longer can be drawn, and a variation range of an m-axis direction component of an off-cut angle and that of an a-axis direction component of the off-cut angle are both 0.05° or less, except for the portion having a distance of less than 5 mm from the outer circumference in a plan view.

16. The c-plane GaN wafer according to claim 14, wherein the variation range of the m-axis direction component of the off-cut angle and that of the a-axis direction component of the off-cut angle are both 0.02° or less.

17. The c-plane GaN wafer according to claim 14, having a diameter selected from 50 mm to 55 mm, 75 mm to 80 mm, 100 mm to 105 mm, and 150 mm to 155 mm.

18. The c-plane GaN wafer according to claim 14, having a dislocation density of lower than $1\times10^6$ cm$^{-2}$ in all of 100 μm×100 μm virtual regions that can be arbitrarily arranged on the specific main surface B, except for the portion having a distance of less than 5 mm from the outer circumference in a plan view.

19. The c-plane GaN wafer according to claim 14, having a dislocation density of lower than $1\times10^5$ cm$^{-2}$ in all of 2 mm×2 mm virtual regions that can be arbitrarily arranged on the specific main surface B, except for the portion having a distance of less than 5 mm from the outer circumference in a plan view.

20. The c-plane GaN wafer according to claim 15, having a dislocation density of lower than $1\times10^6$ cm$^{-2}$ in all of 100 μm×100 μm virtual regions that can be arbitrarily arranged on the third main surface, except for the portion having a distance of less than 5 mm from the outer circumference in a plan view.

21. The c-plane GaN wafer according to claim 15, having a dislocation density of lower than $1\times10^5$ cm$^{-2}$ in 2 mm×2 mm virtual regions that can be arbitrarily arranged on the third main surface, except for the portion having a distance of less than 5 mm from the outer circumference in a plan view.

22. The c-plane GaN wafer according to claim 14, satisfying one or more conditions selected from the following (a) to (g):
(a) the H concentration is $1\times10^{17}$ atoms/cm$^3$ or higher;
(b) the O concentration is $1\times10^{17}$ atoms/cm$^3$ or higher;
(c) the concentration of at least one of Li, Na, and K is lower than $1\times10^{15}$ atoms/cm$^3$;
(d) the F concentration is $1\times10^{15}$ atoms/cm$^3$ or higher;
(e) the concentration of at least one of Cl, Br, and I is $1\times10^{15}$ atoms/cm$^3$ or higher;
(f) the I concentration is $1\times10^{15}$ atoms/cm$^3$ or higher; and
(g) the Si concentration is lower than $2\times10^{15}$ atoms/cm$^3$.

23. The c-plane GaN wafer according to claim 22, having a peak attributed to a gallium vacancy-hydrogen complex at 3,140 to 3,200 cm$^{-1}$ in an infrared absorption spectrum.

24. An epitaxial wafer, comprising:
the c-plane GaN wafer according to claim 14; and
at least one nitride semiconductor layer epitaxially grown on the c-plane GaN wafer.

25. A method of producing an epitaxial wafer, the method comprising the steps of:
preparing the c-plane GaN wafer according to claim 14; and
epitaxially growing at least one nitride semiconductor layer on the c-plane GaN wafer.

26. A method of producing a nitride semiconductor device, the method comprising the steps of:
preparing the c-plane GaN wafer according to claim 14; and
epitaxially growing at least one nitride semiconductor layer on the c-plane GaN wafer.

27. A method of producing a bulk GaN crystal, the method comprising the steps of:
preparing the c-plane GaN wafer according to claim 14; and
epitaxially growing a GaN crystal from a vapor phase on the c-plane GaN wafer.

28. A method of producing a bulk GaN crystal, the method comprising the step of growing a GaN crystal on a seed assembly by an ammonothermal method,
wherein
the seed assembly is constituted by plural c-plane GaN wafers, and
a metal wire is used for immobilizing the plural c-plane GaN wafers with one another.

29. The method of producing a bulk GaN crystal according to claim 28, wherein the orientations of the c-axes, a-axes, and m-axes of all of the c-plane GaN wafers constituting the seed assembly are aligned.

30. The method of producing a bulk GaN crystal according to claim 29, wherein, when the direction of N-polar side of main surfaces of the c-plane GaN wafers constituting the seed assembly is defined as front direction, two or more c-plane GaN wafers each having a rectangular or substantially rectangular main surface are arranged adjacent to each other on the front-direction side of the seed assembly, and a c-plane GaN wafer is arranged on the opposite side of the front direction of the seed assembly.

31. The method of producing a bulk GaN crystal according to claim 28, wherein, in the step of growing a GaN crystal by an ammonothermal method, a mineralizer containing a halogen-containing compound is used, and at least one metal wire selected from an Ag wire, a Pt wire and an Au wire is used as the metal wire.

* * * * *